United States Patent
Kimura

(10) Patent No.: US 12,531,536 B2
(45) Date of Patent: Jan. 20, 2026

(54) ACOUSTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 174 days.

(21) Appl. No.: 18/371,048

(22) Filed: Sep. 21, 2023

(65) Prior Publication Data
US 2024/0014796 A1 Jan. 11, 2024

Related U.S. Application Data

(63) Continuation of application No. PCT/JP2022/015910, filed on Mar. 30, 2022.

(60) Provisional application No. 63/168,324, filed on Mar. 31, 2021.

(51) Int. Cl.
*H03H 9/02* (2006.01)
*H03H 9/05* (2006.01)
(Continued)

(52) U.S. Cl.
CPC .... *H03H 9/02015* (2013.01); *H03H 9/02007* (2013.01); *H03H 9/02228* (2013.01);
(Continued)

(58) Field of Classification Search
CPC ...... H03H 9/205; H03H 9/02007; H03H 9/13; H03H 9/587; H03H 9/64; H03H 9/02015
(Continued)

(56) References Cited

U.S. PATENT DOCUMENTS

2005/0140247 A1* 6/2005 Lee .................... H03H 9/02149
310/320
2006/0267710 A1* 11/2006 Matsumoto ............ H03H 9/175
333/191
(Continued)

FOREIGN PATENT DOCUMENTS

JP 2009290372 A 12/2009
JP 2010028679 A 2/2010
(Continued)

OTHER PUBLICATIONS

International Search Report in PCT/JP2022/015910, mailed Jun. 21, 2022, 3 pages.
(Continued)

*Primary Examiner* — Rakesh B Patel
(74) *Attorney, Agent, or Firm* — Keating & Bennett, LLP

(57) ABSTRACT

An acoustic wave device includes a support including a support substrate with a thickness in a first direction, a piezoelectric layer on the support in the first direction on the support, and resonators each including a functional electrode on the piezoelectric layer in the first direction on the piezoelectric layer. The support includes space portions therein at positions where the functional electrodes at least partially overlap in a planar view in the first direction. The support includes a lead portion communicating with at least one of the space portions in a planar view in the first direction, at a position that does not overlap the space portion. At least one lead portion communicates with at least two of the space portions. The piezoelectric layer includes a through-hole penetrating the piezoelectric layer at a position overlapping the lead portion in a planar view in the first direction.

20 Claims, 18 Drawing Sheets

(51) Int. Cl.
*H03H 9/13* (2006.01)
*H03H 9/205* (2006.01)
*H03H 9/58* (2006.01)
*H03H 9/64* (2006.01)

(52) U.S. Cl.
CPC ............ *H03H 9/0538* (2013.01); *H03H 9/13* (2013.01); *H03H 9/205* (2013.01); *H03H 9/587* (2013.01); *H03H 9/64* (2013.01)

(58) Field of Classification Search
USPC .................................................. 333/186–193
See application file for complete search history.

(56) References Cited

U.S. PATENT DOCUMENTS

| | | |
|---|---|---|
| 2010/0019866 A1 | 1/2010 | Hara et al. |
| 2012/0205754 A1 | 8/2012 | Iwamoto |
| 2017/0170807 A1 | 6/2017 | Yokoyama et al. |
| 2020/0065954 A1 | 2/2020 | Komatsu et al. |
| 2021/0091747 A1 | 3/2021 | Turner et al. |

FOREIGN PATENT DOCUMENTS

| | | |
|---|---|---|
| JP | 2010147874 A | 7/2010 |
| JP | 2012257019 A | 12/2012 |
| JP | 2017108288 A | 6/2017 |
| JP | 2019009671 A | 1/2019 |
| JP | 2020028679 A | 2/2020 |
| WO | 2011052551 A1 | 5/2011 |

OTHER PUBLICATIONS

Written Opinion in PCT/JP2022/015910, mailed Jun. 21, 2022, 5 pages.

* cited by examiner

ACOUSTIC WAVE DEVICE

CROSS REFERENCE TO RELATED APPLICATIONS

This application claims the benefit of priority to Provisional Application No. 63/168,324 filed on Mar. 31, 2021 and is a Continuation Application of PCT Application No. PCT/JP2022/015910 filed on Mar. 30, 2022. The entire contents of each application are hereby incorporated herein by reference.

BACKGROUND OF THE INVENTION

1. Field of the Invention

The present disclosure relates to an acoustic wave device.

2. Description of the Related Art

Japanese Unexamined Patent Application Publication No. 2012-257019 describes an acoustic wave device.

In the acoustic wave device disclosed in Japanese Unexamined Patent Application Publication No. 2012-257019, a space portion may be provided between a piezoelectric layer, on which resonators are provided, and a support substrate. When a plurality of resonators are provided on the piezoelectric layer, etching holes in the space portion may limit the positions of the resonators.

SUMMARY OF THE INVENTION

Preferred embodiments of the present invention enable resonators to be provided more freely.

An acoustic wave device according to a preferred embodiment of the present invention includes a support including a support substrate with a thickness in a first direction, a piezoelectric layer provided on the support in the first direction, and a plurality of resonators each including a functional electrode provided on the piezoelectric layer in the first direction. The support includes a plurality of space portions provided therein at positions where the functional electrodes of the plurality of resonators at least partially overlap in a planar view in the first direction. The support includes a lead portion, which communicates with at least one of the space portions in a planar view in the first direction, at a position that does not overlap the space portion. At least one lead portion communicates with at least two of the space portions. The piezoelectric layer includes a through-hole penetrating the piezoelectric layer at a position overlapping the lead portion in a planar view in the first direction.

According to preferred embodiments of the present invention, resonators can be provided more freely.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. The present disclosure is not limited to the preferred embodiments. The preferred embodiments described in the present disclosure are illustrative. Description of matters common to those in the first preferred embodiment will be omitted and only different points will be described in modifications and the second and subsequent preferred embodiments where partial replacement or combination of configurations is possible among different preferred embodiments. In particular, the same or similar advantageous actions and effects of the same or similar configurations are not described sequentially for each preferred embodiment.

First Preferred Embodiment

Figure 1A:
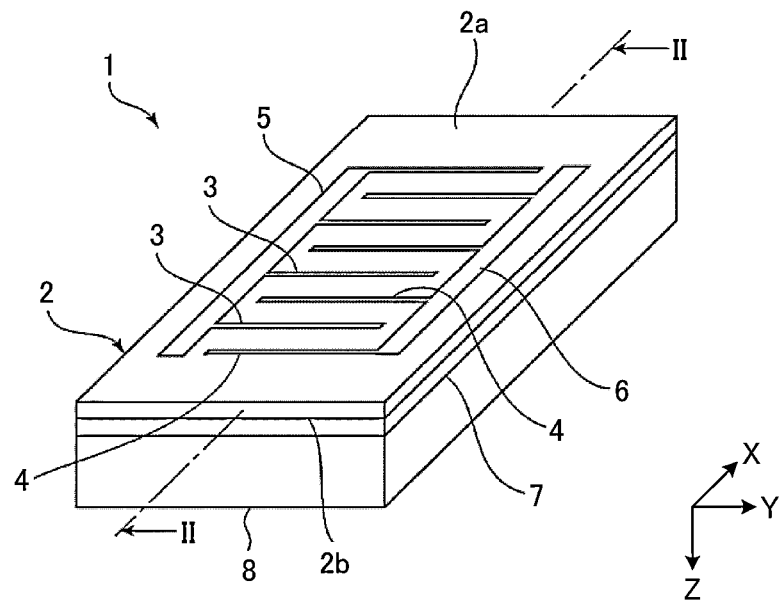
FIG. 1A is a perspective view illustrating an acoustic wave device according to a first preferred embodiment of the present invention.
Figure 1B:
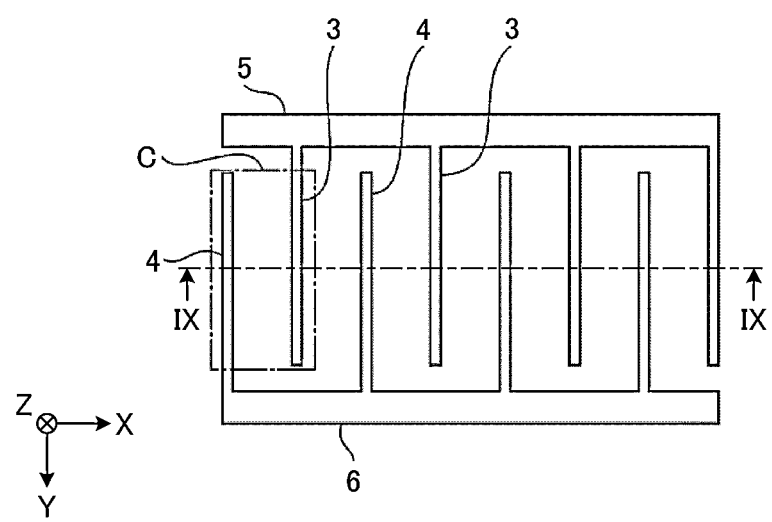
FIG. 1B is a plan view illustrating an electrode structure according to the first preferred embodiment of the present invention.

FIG. 1A is a perspective view illustrating an acoustic wave device according to a first preferred embodiment. FIG. 1B is a plan view illustrating an electrode structure according to the first preferred embodiment.

An acoustic wave device 1 according to the first preferred embodiment includes a piezoelectric layer 2 made of, for example, LiNbO$_3$. The piezoelectric layer 2 may be made of, for example, LiTaO$_3$. A cut-angle of LiNbO$_3$ or LiTaO$_3$ is a Z cut in the first preferred embodiment. The cut-angle of LiNbO$_3$ or LiTaO$_3$ may be a rotational Y cut or X cut. The cut-angle is preferably a propagation direction of about ±30° of Y propagation and X propagation.

The thickness of the piezoelectric layer 2 is preferably, but not particularly limited to, for example, more than or equal to about 50 nm and less than or equal to about 1000 nm for effective excitation of a first thickness-shear mode.

The piezoelectric layer 2 includes a first major surface 2a and a second major surface 2b facing each other in a Z-direction. Electrode fingers 3 and 4 are provided on the first major surface 2a.

The electrode finger 3 is an example of "first electrode finger" and the electrode finger 4 is an example of "second electrode finger". In FIGS. 1A and 1B, the plurality of electrode fingers 3 are a plurality of "first electrode fingers" connected to a first busbar electrode 5. The plurality of electrode fingers 4 are a plurality of "second electrode fingers" connected to a second busbar electrode 6. The plurality of electrode fingers 3 and the plurality of electrode fingers 4 are interdigitated with each other. An interdigital transducer (IDT) electrode is thus provided, including the electrode fingers 3, electrode fingers 4, first busbar electrode 5, and second busbar electrode 6.

The electrode fingers 3 and 4 each have a rectangular or substantially rectangular shape and a length direction. The electrode finger 3 and the electrode finger 4 adjacent to the electrode finger 3 face each other in a direction orthogonal or substantially orthogonal to the length direction. Both of the length direction of the electrode fingers 3 and 4 and the direction orthogonal or substantially orthogonal to the length direction of the electrode fingers 3 and 4 are directions that intersect the thickness direction of the piezoelectric layer 2.

It can therefore be said that the electrode finger 3 and the electrode finger 4 adjacent to the electrode finger 3 face each other in the direction intersecting the thickness direction of the piezoelectric layer 2. In the following description, the thickness direction of the piezoelectric layer 2 may be defined as the Z direction (or a first direction), the length direction of the electrode fingers 3 and 4 may be defined as a Y direction (or a second direction), and the direction orthogonal or substantially orthogonal to the electrode fingers 3 and 4 may be defined as an X direction (or a third direction).

The length direction of the electrode fingers 3 and 4 may be interchanged with the direction orthogonal or substantially orthogonal to the length direction of the electrode fingers 3 and 4 illustrated in FIGS. 1A and 1B. That is, in FIGS. 1A and 1B, the electrode fingers 3 and 4 may extend in a direction in which the first busbar electrode 5 and the second busbar electrode 6 extend. In that case, the first busbar electrode 5 and the second busbar electrode 6 extend in the direction in which the electrode fingers 3 and 4 extend in FIGS. 1A and 1B. A plurality of pairs of structures in which the electrode fingers 3 connected to one potential and the electrode fingers 4 connected to the other potential are adjacent to each other are provided in the direction orthogonal or substantially orthogonal to the length direction of the electrode fingers 3 and 4.

Such a situation where the electrode fingers 3 and 4 are adjacent to each other refers to a case where the electrode fingers 3 and 4 are disposed with a space therebetween, rather than a case where the electrode fingers 3 and 4 are disposed in direct contact with each other. When the electrode fingers 3 and 4 are adjacent to each other, electrodes connected to a hot electrode or a ground electrode, including other electrode fingers 3 and 4, are not disposed between the electrode fingers 3 and 4. The number of pairs does not need to be integer pairs but may be 1.5 pairs, 2.5 pairs, or the like.

A center-to-center distance, that is, a pitch between the electrode fingers 3 and 4 is preferably, for example, in the range of about 1 μm to about 10 μm. The center-to-center distance between the electrode fingers 3 and 4 means a distance connecting the center of the width dimension of the electrode finger 3 in the direction orthogonal or substantially orthogonal to the length direction of the electrode finger 3 to the center of the width dimension of the electrode finger 4 in the direction orthogonal or substantially orthogonal to the length direction of the electrode finger 4.

When at least one of the electrode fingers 3 and 4 is provided in a plural number (when there are 1.5 or more pairs of electrodes assuming that the electrode fingers 3 and 4 are defined as one electrode pair), the center-to-center distance between the electrode fingers 3 and 4 refers to the average value of the center-to-center distances between adjacent electrode fingers 3 and 4 among 1.5 or more pairs of electrode fingers 3 and 4.

The width of the electrode fingers 3 and 4, that is, the dimension of the electrode fingers 3 and 4 in the facing direction is preferably, for example, in the range of about 150 nm to about 1000 nm. The center-to-center distance between the electrode fingers 3 and 4 is the distance connecting the center of the dimension (width dimension) of the electrode finger 3 in the direction orthogonal to the length direction of the electrode finger 3 to the center of the dimension (width dimension) of the electrode finger 4 in the direction orthogonal or substantially orthogonal to the length direction of the electrode finger 4.

In the first preferred embodiment, the Z-cut piezoelectric layer is used, and thus the direction orthogonal or substantially orthogonal to the length direction of the electrode fingers 3 and 4 is the direction orthogonal or substantially orthogonal to a polarization direction of the piezoelectric layer 2. Provided, however, that a piezoelectric material having a different cut-angle is used as the piezoelectric layer 2. The term "orthogonal" is not limited to being strictly orthogonal but may be substantially orthogonal (the angle formed by the direction orthogonal to the length direction of the electrode fingers 3 and 4 and the polarization direction is, for example, about 90°±10').

Figure 2:
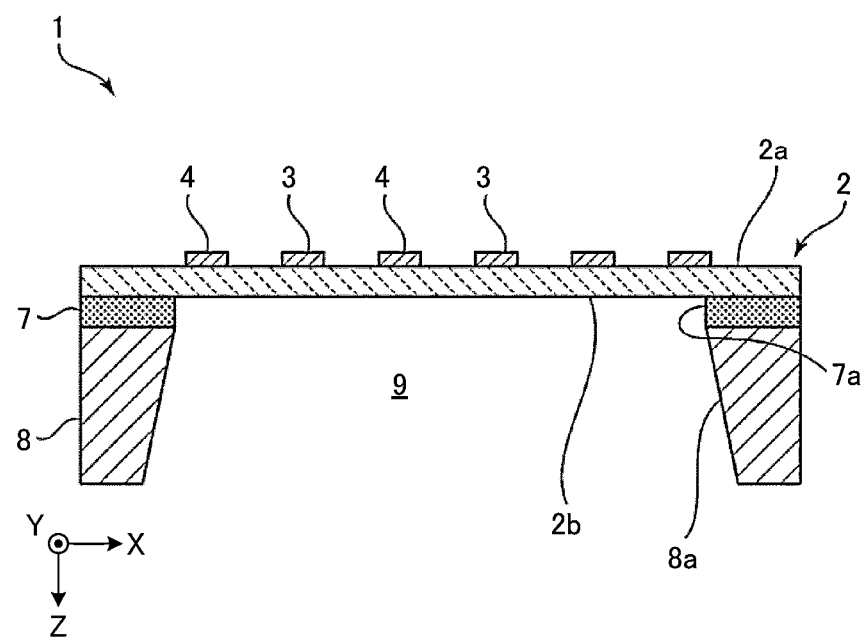
FIG. 2 is a cross-sectional view taken along line II-II in FIG. 1A.

A support substrate 8 is laminated on the second major surface 2b side of the piezoelectric layer 2 with a dielectric layer 7 interposed therebetween. The dielectric layer 7 and the support substrate 8 have a frame shape and cavities 7a and 8a, as illustrated in FIG. 2, which define a space portion (air gap) 9.

The space portion 9 is provided so as not to disturb the vibration of an excitation region C of the piezoelectric layer 2. The support substrate 8 is therefore laminated on the second major surface 2b with the dielectric layer 7 interposed therebetween at a position not overlapping the portion where at least one pair of electrode fingers 3 and 4 are provided. The dielectric layer 7 does not need to be provided. The support substrate 8 can thus be directly or indirectly laminated on the second major surface 2b of the piezoelectric layer 2.

The dielectric layer 7 is made of, for example, silicon oxide. However, the dielectric layer 7 can be made of an appropriate insulating material such as, for example, silicon nitride, alumina, etc., in addition to silicon oxide.

The support substrate 8 is made of, for example, Si. The plane orientation of the surface of Si on the piezoelectric layer 2 side may be (100) or (110), or may be (111). High-resistance Si having a resistivity of, for example, about 4 kΩ or more is preferably used. The support substrate 8 can also be made using an appropriate insulating material or semiconductor material. As the material of the support substrate 8, for example, piezoelectric materials such as aluminum oxide, lithium tantalate, lithium niobate, and crystal, various ceramics such as alumina, magnesia, sapphire, silicon nitride, aluminum nitride, silicon carbide, zirconia, cordierite, mullite, steatite, and forsterite, dielectrics such as diamond and glass, semiconductors such as gallium nitride, and the like can be used.

The plurality of electrode fingers 3 and 4, the first busbar electrode 5, and the second busbar electrode 6 are made of appropriate metals or alloys such as, for example, Al and AlCu alloys. In the first preferred embodiment, the electrode fingers 3 and 4, the first busbar electrode 5, and the second busbar electrode 6 have a structure in which, for example, an Al film is laminated on a Ti film. A close contact layer other than the Ti film may be used.

For driving, an alternating-current (AC) voltage is applied between the plurality of electrode fingers 3 and the plurality of electrode fingers 4. More specifically, the AC voltage is applied between the first busbar electrode 5 and the second busbar electrode 6. This can make it possible to obtain resonance characteristics using first thickness-shear mode bulk waves excited in the piezoelectric layer 2.

In the acoustic wave device 1, d/p is, for example, about 0.5 or less where d is the thickness of the piezoelectric layer 2 and p is the center-to-center distance between any adjacent electrode fingers 3 and 4 among the plurality of pairs of electrode fingers 3 and 4. Therefore, the first thickness-shear mode bulk waves can be effectively excited to obtain good resonance characteristics. d/p is, for example, more preferably about 0.24 or less. In that case, even better resonance characteristics can be obtained.

When at least one of the electrode fingers 3 and 4 is provided in a plural number as the first preferred embodiment, that is, when there are 1.5 or more pairs of electrode fingers 3 and 4 assuming that the electrode fingers 3 and 4 are defined as one electrode pair, the center-to-center distance p between the adjacent electrode fingers 3 and 4 is the average distance of the center-to-center distances between the adjacent electrode fingers 3 and 4.

Since the acoustic wave device 1 according to the first preferred embodiment has the above configuration, a Q value is unlikely to decrease even when the number of pairs of the electrode fingers 3 and 4 is reduced to reduce the size of the device. This is because the resonator does not require reflectors on both sides and propagation loss is small. The reason why the reflectors are not required is that the first thickness-shear mode bulk waves are used.

Figure 3A:
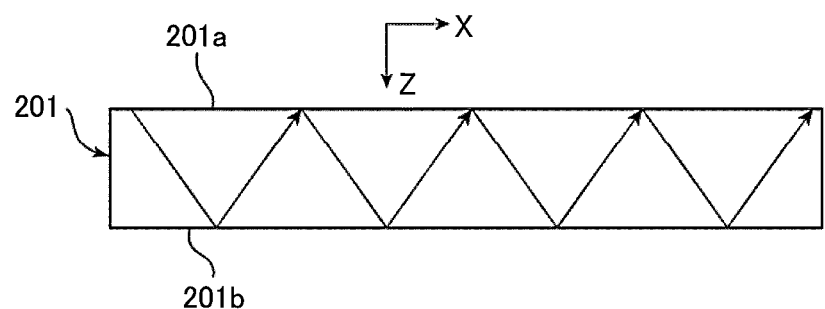
FIG. 3A is a schematic cross-sectional view for explaining Lamb waves propagating through a piezoelectric layer in a comparative example.
Figure 3B:
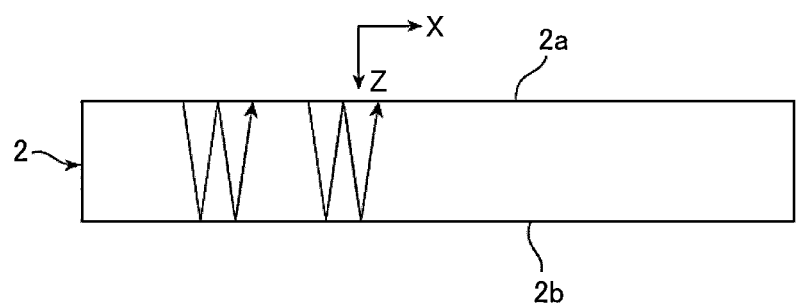
FIG. 3B is a schematic cross-sectional view for explaining first thickness-shear mode bulk waves propagating through the piezoelectric layer according to the first preferred embodiment of the present invention.
Figure 4:
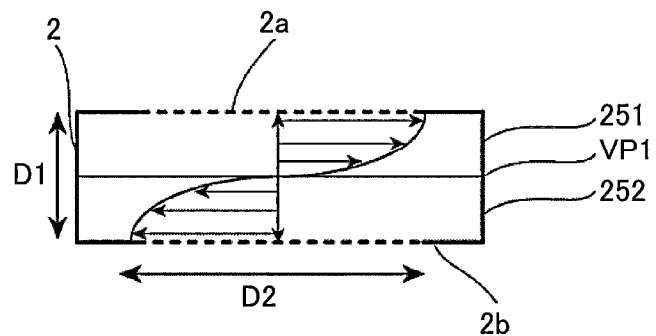
FIG. 4 is a schematic cross-sectional view for explaining an amplitude direction of the first thickness-shear mode bulk waves propagating through the piezoelectric layer according to the first preferred embodiment of the present invention.

FIG. 3A is a schematic cross-sectional view for explaining Lamb waves propagating through the piezoelectric layer in a comparative example. FIG. 3B is a schematic cross-sectional view for explaining first thickness-shear mode bulk waves propagating through the piezoelectric layer in the first preferred embodiment. FIG. 4 is a schematic cross-sectional view for explaining the amplitude direction of the first thickness-shear mode bulk waves propagating through the piezoelectric layer in the first preferred embodiment.

FIG. 3A illustrates an acoustic wave device as described in Japanese Unexamined Patent Application Publication No. 2012-257019, in which Lamb waves propagate through a piezoelectric layer. As illustrated in FIG. 3A, waves propagate through a piezoelectric layer 201 as indicated by arrows. The piezoelectric layer 201 includes a first major surface 201a and a second major surface 201b, and a thickness direction connecting the first major surface 201a and the second major surface 201b is a Z direction. An X direction is the direction in which electrode fingers 3 and 4 of IDT electrodes are arranged. As illustrated in FIG. 3A, the Lamb waves propagate in the X direction. Since the Lamb waves are plate waves, the waves propagate in the X direction while the entire piezoelectric layer 201 vibrates. Therefore, reflectors are disposed on both sides to obtain resonance characteristics. This causes wave propagation loss. The Q value decreases when trying to reduce the size of the device, that is, reducing the number of pairs of the electrode fingers 3 and 4.

In the acoustic wave device according to the first preferred embodiment, as illustrated in FIG. 3B, on the other hand, vibration displacement occurs in the thickness-shear direction. This causes the waves to propagate and resonate substantially in the direction connecting the first major surface 2a and the second major surface 2b of the piezoelectric layer 2, that is, in the Z direction. More specifically, an X-direction component of the wave is significantly smaller than a Z-direction component. This wave propagation in the Z direction achieves the resonance characteristics, thus eliminating the need for reflectors. Therefore, no propagation loss occurs in propagation to the reflector. The Q value is thus unlikely to decrease even when the number of electrode pairs including the electrode fingers 3 and 4 is reduced to attempt to further reduce the size of the device.

As illustrated in FIG. 4, the amplitude direction of the first thickness-shear mode bulk waves is opposite between a first region 251 included in the excitation region C (see FIG. 1B) of the piezoelectric layer 2 and a second region 252 included in the excitation region C. FIG. 4 schematically illustrates bulk waves when a voltage is applied between the electrode fingers 3 and 4 so that the electrode fingers 4 have a higher potential than the electrode fingers 3. The first region 251 is a region of the excitation region C between the virtual plane VP1 and the first major surface 2*a*. The virtual plane VP1 is orthogonal or substantially orthogonal to the thickness direction of the piezoelectric layer 2 and bisects the piezoelectric layer 2. The second region 252 is a region of the excitation region C between the virtual plane VP1 and the second major surface 2*b*.

In the acoustic wave device 1, at least one pair of electrodes including the electrode fingers 3 and 4 is provided. It is not always necessary to provide a plurality of pairs of electrodes including the electrode fingers 3 and 4 since those pairs are not for propagating waves in the X direction. That is, it is sufficient that at least one pair of electrodes is provided.

For example, the electrode finger 3 is an electrode connected to a hot potential and the electrode finger 4 is an electrode connected to a ground potential. The electrode finger 3 may be connected to the ground potential and the electrode finger 4 may be connected to the hot potential. In the first preferred embodiment, at least one pair of electrodes are the electrode connected to the hot potential or electrode connected to the ground potential, as described above, and no floating electrodes are provided.

Figure 5:
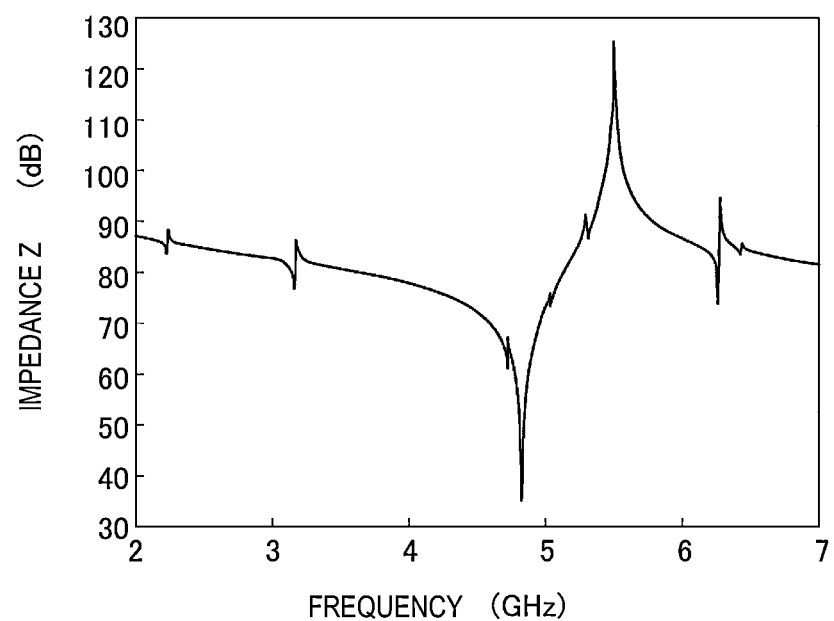
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device according to the first preferred embodiment. The acoustic wave device 1 that has obtained resonance characteristics illustrated in FIG. 5 has the following design parameters.

Piezoelectric layer 2: Thickness of LiNbO$_3$ piezoelectric layer 2 with Euler angles (0°, 0°, 90°): about 400 nm
Length of excitation region C (see FIG. 1B): about 40 µm
Number of electrode pairs consisting of electrode fingers 3 and 4: 21
Center-to-center distance (pitch) between electrode fingers 3 and 4: about 3 µm
Width of electrode fingers 3 and 4: about 500 nm d/p: about 0.133
Dielectric layer 7: about 1 µm thick silicon oxide film
Support substrate 8: Si The excitation region C (see FIG. 1B) is a region where the electrode fingers 3 and 4 overlap when viewed in the X direction orthogonal or substantially orthogonal to the length direction of the electrode fingers 3 and 4. The length of the excitation region C is the dimension of the excitation region C along the length direction of the electrode fingers 3 and 4. The excitation region C is an example of "intersecting region".

In the first preferred embodiment, a plurality of electrode pairs including the electrode fingers 3 and 4 all have an equal or substantially equal interelectrode distance. That is, the electrode fingers 3 and 4 are disposed at an equal or substantially equal pitch.

As is clear from FIG. 5, good resonance characteristics with a fractional band width of, for example, about 12.5% are obtained even though no reflectors are provided.

In the first preferred embodiment, d/p is, for example, about 0.5 or less, and preferably, about 0.24 or less, where d is the thickness of the piezoelectric layer 2 and p is the center-to-center distance between the electrode fingers 3 and 4. This will be described with reference to FIG. 6.

Figure 6:
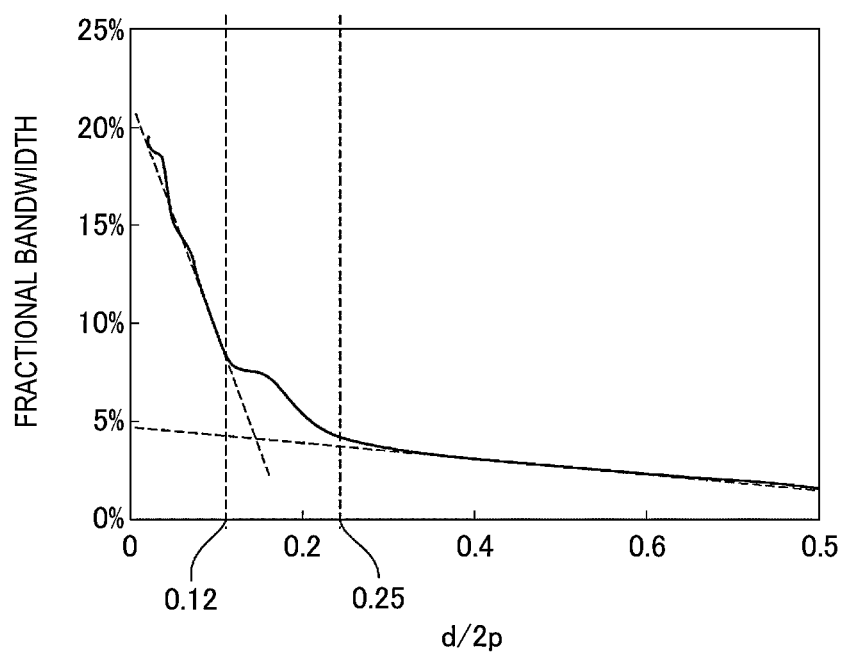
FIG. 6 is an explanatory diagram illustrating a relationship between d/2p, where p is a center-to-center distance between adjacent electrodes or the average of the center-to-center distances and d is an average thickness of the piezoelectric layer, and a fractional band width of a resonator in the acoustic wave device according to the first preferred embodiment of the present invention.

A plurality of acoustic wave devices are obtained by changing d/2p in the same manner as the acoustic wave device that has obtained the resonance characteristics illustrated in FIG. 5. FIG. 6 is an explanatory diagram illustrating a relationship between d/2p, where p is a center-to-center distance between adjacent electrodes or the average of the center-to-center distances and d is an average thickness of the piezoelectric layer 2, and a fractional band width of a resonator in the acoustic wave device according to the first preferred embodiment.

As illustrated in FIG. 6, when d/2p exceeds, for example, about 0.25, that is, when d/p>about 0.5, the fractional band width is less than about 5% even when d/p is adjusted. When d/2p≤about 0.25, for example, that is, when d/p≤about 0.5, on the other hand, the fractional band width can be set to about 5% or more by changing d/p within that range. More specifically, a resonator having a high coupling coefficient can be provided. When d/2p is, for example, about 0.12 or less, that is, when d/p is about 0.24 or less, the fractional band width can be increased to about 7% or more. By adjusting d/p within this range, a resonator with a wider fractional band width can be obtained, and a resonator with a higher coupling coefficient can be obtained. Therefore, by setting d/p to, for example, about 0.5 or less, a resonator having a high coupling coefficient can be provided using the first thickness-shear mode bulk wave.

At least one pair of electrodes may be one pair, and the p described above is the center-to-center distance between adjacent electrode fingers 3 and 4 in the case of one pair of electrodes. In the case of 1.5 pairs or more of electrodes, p is the average distance of the center-to-center distances between adjacent electrode fingers 3 and 4.

As for the thickness d of the piezoelectric layer 2, when the piezoelectric layer 2 has variations in thickness, a value obtained by averaging the thickness may be used.

Figure 7:
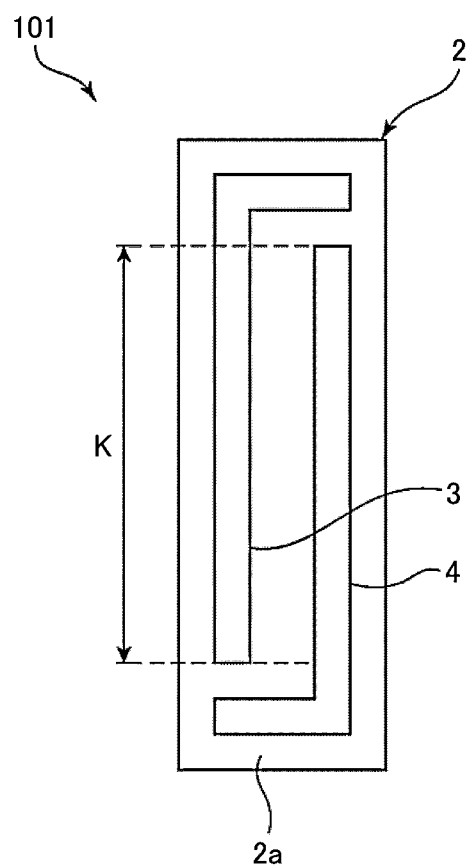
FIG. 7 is a plan view illustrating an example where a pair of electrodes are provided in the acoustic wave device according to the first preferred embodiment of the present invention.

FIG. 7 is a plan view illustrating an example where a pair of electrodes are provided in the acoustic wave device according to the first preferred embodiment. In an acoustic wave device 101, a pair of electrodes including electrode fingers 3 and 4 are provided on a first major surface 2*a* of a piezoelectric layer 2. K in FIG. 7 represents an intersecting width. As described above, in the acoustic wave device, the number of pairs of electrodes may be one. In this case, again, first thickness-shear mode bulk waves can be effectively excited when the d/p described above is, for example, about 0.5 or less.

In the acoustic wave device 1, it is preferable that a metallization ratio MR of any adjacent electrode fingers 3 and 4 among the plurality of electrode fingers 3 and 4 with respect to the excitation region C, which is an overlapping region when viewed in the direction in which the adjacent electrode fingers 3 and 4 face each other, satisfies, for example, MR≤about 1.75 (d/p)+0.075. In that case, spurious emissions can be effectively reduced. This will be described with reference to FIGS. 8 and 9.

Figure 8:
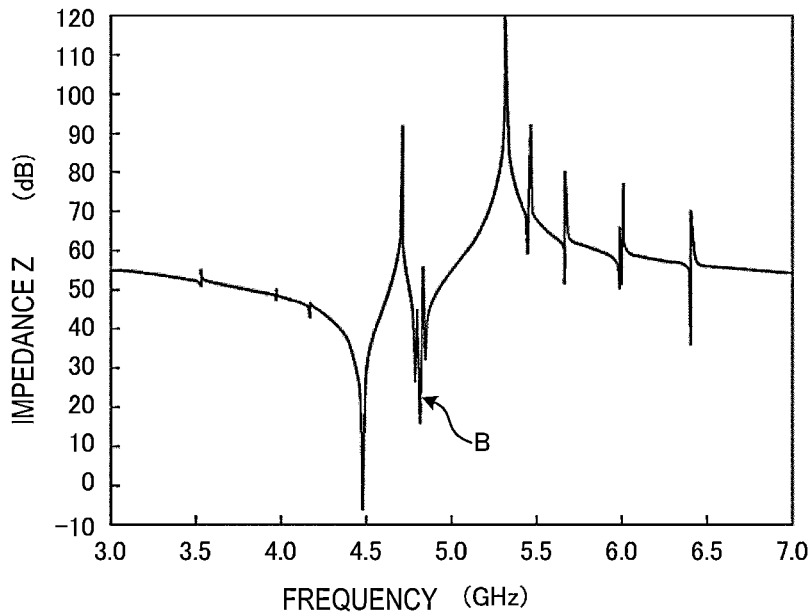
FIG. 8 is a reference diagram illustrating an example of the resonance characteristics of the acoustic wave device according to the first preferred embodiment of the present invention.

FIG. 8 is a reference diagram illustrating an example of resonance characteristics of the acoustic wave device according to the first preferred embodiment. A spurious emission indicated by an arrow B appears between a resonant frequency and an anti-resonant frequency. d/p is, for example, about 0.08 and the Euler angles of LiNbO$_3$ are (0°, 0°, 90°). The metallization ratio MR is set to, for example, about 0.35.

The metallization ratio MR will be described with reference to FIG. 1B. In the electrode structure illustrated in FIG. 1B, focusing on the pair of electrode fingers 3 and 4, it is assumed that only this one pair of electrode fingers 3 and 4 are provided. In this case, the excitation region C is a portion surrounded by the dashed-dotted line. The excitation region C is a region of the electrode finger 3 that overlaps the electrode finger 4 and a region of the electrode finger 4 that overlaps the electrode finger 3 when the electrode fingers 3 and 4 are viewed in the direction orthogonal to the length direction of the electrode fingers 3 and 4, that is, in a facing direction, as well as a region where the electrode fingers 3 and 4 overlap each other in a region between the electrode fingers 3 and 4. A ratio of the area of the electrode fingers 3 and 4 in the excitation region C with respect to the area of the excitation region C is the metallization ratio MR. That is, the metallization ratio MR is the ratio of the area of a metallization portion to the area of the excitation region C.

When a plurality of pairs of electrode fingers 3 and 4 are provided, the ratio of the metallization portions included in the entire excitation region C to the total area of the excitation region C may be defined as MR.

Figure 9:
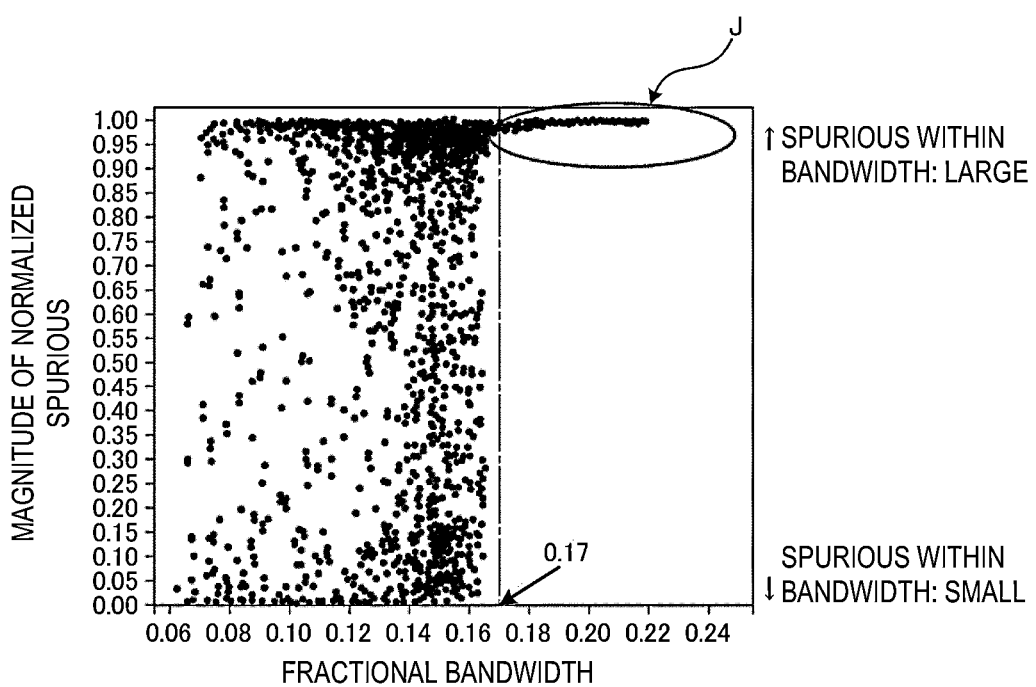
FIG. 9 is an explanatory diagram illustrating a relationship between a fractional band width when a number of acoustic wave resonators are configured in the acoustic wave device according to the first preferred embodiment of the present invention, and a phase rotation amount of spurious impedance normalized by about 180 degrees as the spurious magnitude.

FIG. 9 is an explanatory diagram illustrating a relationship between a fractional band width when a number of acoustic wave resonators are configured in the acoustic wave device according to the first preferred embodiment, and a phase rotation amount of spurious impedance normalized by about 180 degrees as the spurious magnitude. The fractional band width is adjusted by changing a film thickness of the piezoelectric layer 2 and the dimensions of the electrode fingers 3 and 4. FIG. 9 illustrates the results when the Z-cut piezoelectric layer 2 made of, for example, $LiNbO_3$ is used, but the same tendency is observed when the piezoelectric layer 2 with other cut-angles is used.

In the region surrounded by an ellipse J in FIG. 9, the spurious emission is as large as about 1.0, for example. As is clear from FIG. 9, when the fractional band width exceeds, for example, about 0.17, that is, about 17%, a large spurious emission with a spurious level of about 1 or more appears within a pass band even though the parameters constituting the fractional band width are changed. More specifically, as in the resonance characteristics illustrated in FIG. 8, a large spurious emission indicated by the arrow B appears within the band. Therefore, the fractional band width is preferably, for example, about 17% or less. In this case, the spurious emission can be reduced by adjusting the film thickness of the piezoelectric layer 2, the dimensions of the electrode fingers 3 and 4, and the like.

Figure 10:
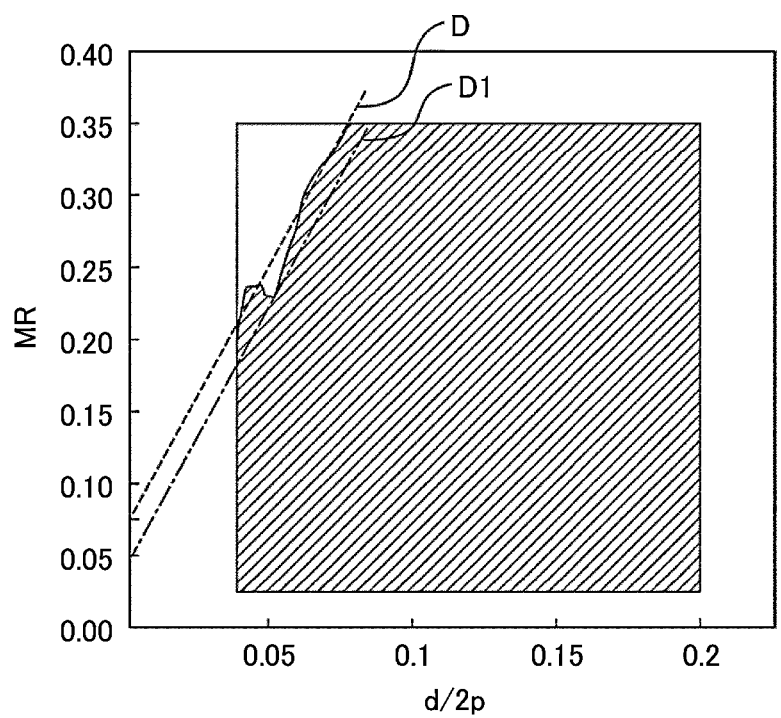
FIG. 10 is an explanatory diagram illustrating a relationship between d/2p, metallization ratio MR, and fractional band width.

FIG. 10 is an explanatory diagram illustrating a relationship between d/2p, metallization ratio MR, and fractional band width. In the acoustic wave device 1 according to the first preferred embodiment, various acoustic wave devices 1 that differ in d/2p and MR are configured and the fractional band width is measured. The hatched portion on the right side of the dashed line D in FIG. 10 is the region where the fractional band width is about 17% or less. The boundary between the hatched region and the non-hatched region is expressed by MR=about 3.5(d/2p)+0.075. That is, MR=about 1.75(d/p)+0.075, therefore preferably, for example, MR≤about 1.75(d/p)+0.075. In that case, the fractional band width is easily set to about 17% or less, and is preferably the region on the right side of MR=about 3.5(d/2p)+0.05 indicated by the dashed-dotted line D1 in FIG. 10. That is, if MR≤about 1.75(d/p)+0.05, the fractional band width can be reliably set to about 17% or less.

Figure 11:
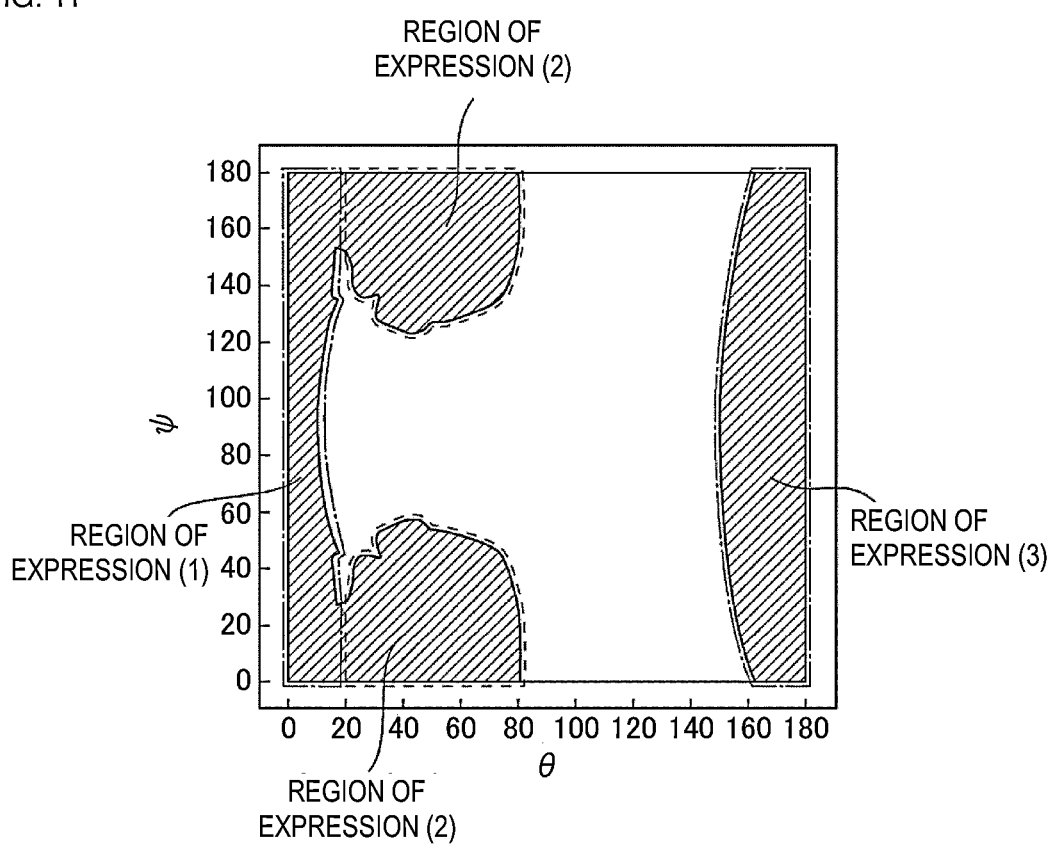
FIG. 11 is an explanatory diagram illustrating a map of the fractional band width with respect to Euler angles (0°, θ, ψ) of LiNbO$_3$ when d/p is brought infinitely close to 0.

FIG. 11 is an explanatory diagram illustrating a map of the fractional band width with respect to the Euler angles (0°, θ, ψ) of $LiNbO_3$ when d/p is brought infinitely close to 0. The hatched portion in FIG. 11 is the region where the fractional band width of, for example, at least about 5% or more is obtained. By approximating the range of the region, a region represented by the following expressions (1), (2), and (3) is obtained.

$(0°±10°, 0°$ to $20°$, arbitrary $\psi)$   Expression (1)

$(0°±10°, 20°$ to $80°, 0°$ to $60°(1-(\theta-50)^2/900)^{1/2})$ or $(0°±10°, 20°$ to $80°, [180°-60°(1-(\theta-50)^2/900)^{1/2}]$ to $180°)$   Expression (2)

$(0°±10°, [180°-30°(1-(\psi-90)^2/8100)^{1/2}]$ to $180°$, arbitrary $\psi)$   Expression (3)

Therefore, in the case of the Euler angle range of Expression (1), Expression (2) or Expression (3), the fractional band width can be sufficiently increased, which is preferable.

Figure 12:
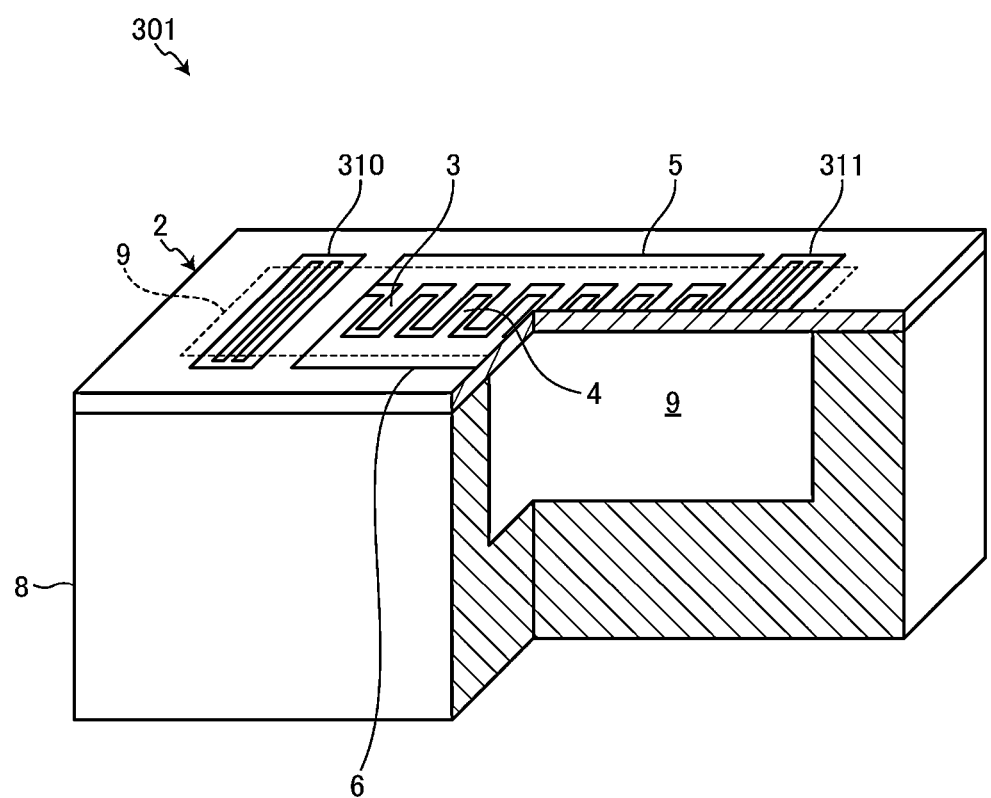
FIG. 12 is a partially cutaway perspective view for explaining an acoustic wave device according to a preferred embodiment of the present invention.

FIG. 12 is a partially cutaway perspective view for explaining an acoustic wave device according to a preferred embodiment of the present invention. In FIG. 12, the outer peripheral edge of a space portion 9 is indicated by the dashed line. The acoustic wave device of the present preferred embodiment may use plate waves. In this case, an acoustic wave device 301 includes reflectors 310 and 311 as illustrated in FIG. 12. The reflectors 310 and 311 are provided on both sides of electrode fingers 3 and 4 in a piezoelectric layer 2 in an acoustic wave propagation direction. In the acoustic wave device 301, Lamb waves as plate waves are excited by applying an AC electric field to the electrode fingers 3 and 4 above the space portion 9. In this event, the reflectors 310 and 311 provided on both sides can obtain resonance characteristics by the Lamb waves as plate waves.

As described above, the acoustic wave devices 1 and 101 use the first thickness-shear mode bulk waves. In the acoustic wave devices 1 and 101, the first electrode finger 3 and the second electrode finger 4 are adjacent electrodes and d/p is set to, for example, about 0.5 or less, where d is the thickness of the piezoelectric layer 2 and p is the center-to-center distance between the first electrode finger 3 and the second electrode finger 4. This can increase the Q value even when the acoustic wave device is reduced in size.

In the acoustic wave devices 1 and 101, the piezoelectric layer 2 is made of, for example, lithium niobate or lithium tantalate. The first major surface 2a or the second major surface 2b of the piezoelectric layer 2 includes the first electrode fingers 3 and second electrode fingers 4 provided thereon, facing each other in the direction intersecting the thickness direction of the piezoelectric layer 2. It is preferable that the first electrode fingers 3 and the second electrode fingers 4 are covered with a protective film.

Figure 13:
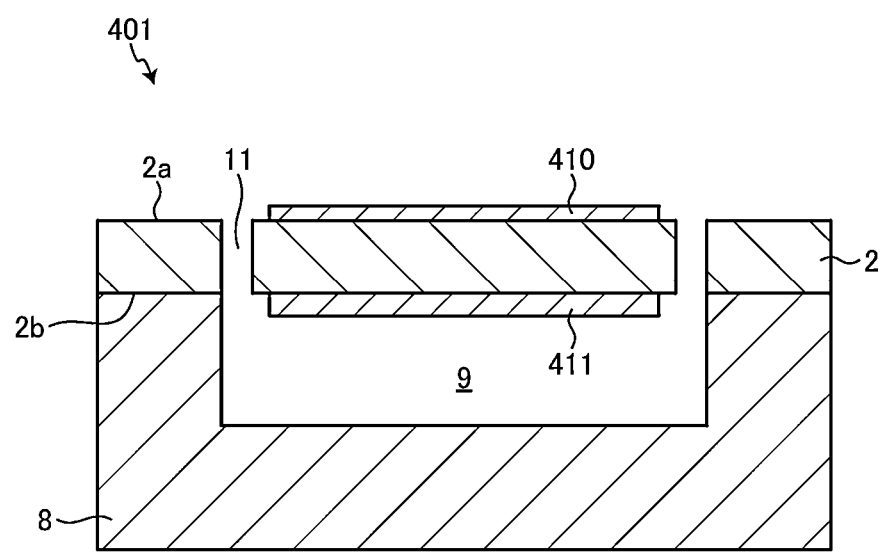
FIG. 13 is a cross-sectional view for explaining an acoustic wave device according to a preferred embodiment of the present invention.

FIG. 13 is a cross-sectional view for explaining an acoustic wave device according to a preferred embodiment of the present invention. The acoustic wave device of the present preferred embodiment may be a device using bulk waves as illustrated in FIG. 13, that is, a bulk acoustic wave (BAW) device. In this case, an acoustic wave device 401 includes functional electrodes 410 and 411. The functional electrodes 410 and 411 are electrodes provided on both sides of a piezoelectric layer 2 in its thickness direction. In the example of FIG. 13, a support substrate 8 includes a space portion 9 on the piezoelectric layer 2 side and the functional electrode 411 is provided inside the space portion 9.

In the example of FIG. 13, a through-hole 11 is provided in the piezoelectric layer 2. The through-hole 11 is a hole penetrating the piezoelectric layer 2 in the Z direction. The through-hole 11 communicates with the space portion 9. The through-hole 11 provided in the piezoelectric layer 2 can be used to etch a sacrificial layer, which is previously provided in the space portion 9 before bonding of the piezoelectric layer 2 and the support substrate 8, by pouring an etchant through the through-hole 11 after the piezoelectric layer 2 is bonded to the support substrate 8.

Figure 14:
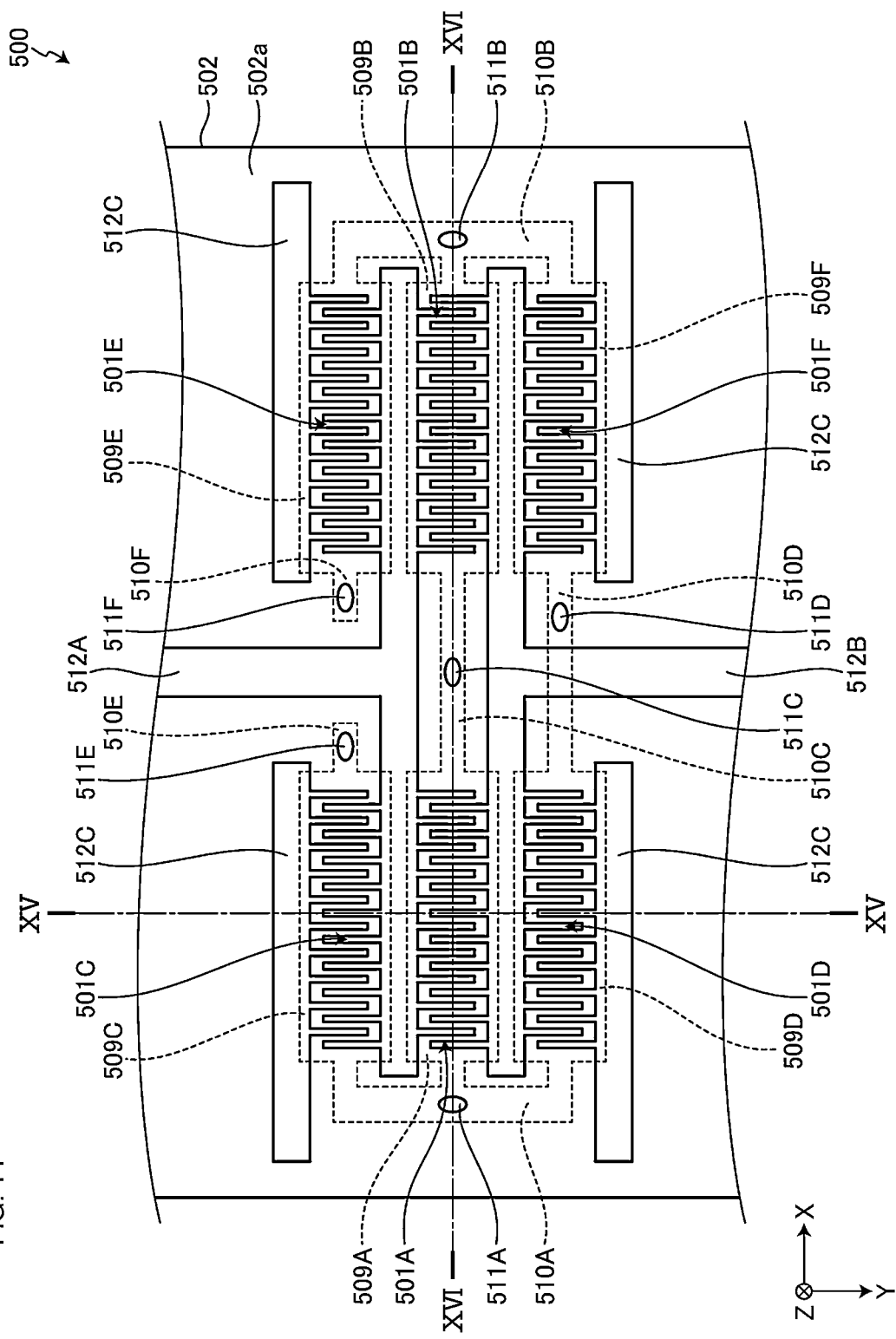
FIG. 14 is a plan view illustrating an example of the acoustic wave device according to the first preferred embodiment of the present invention.
Figure 15:
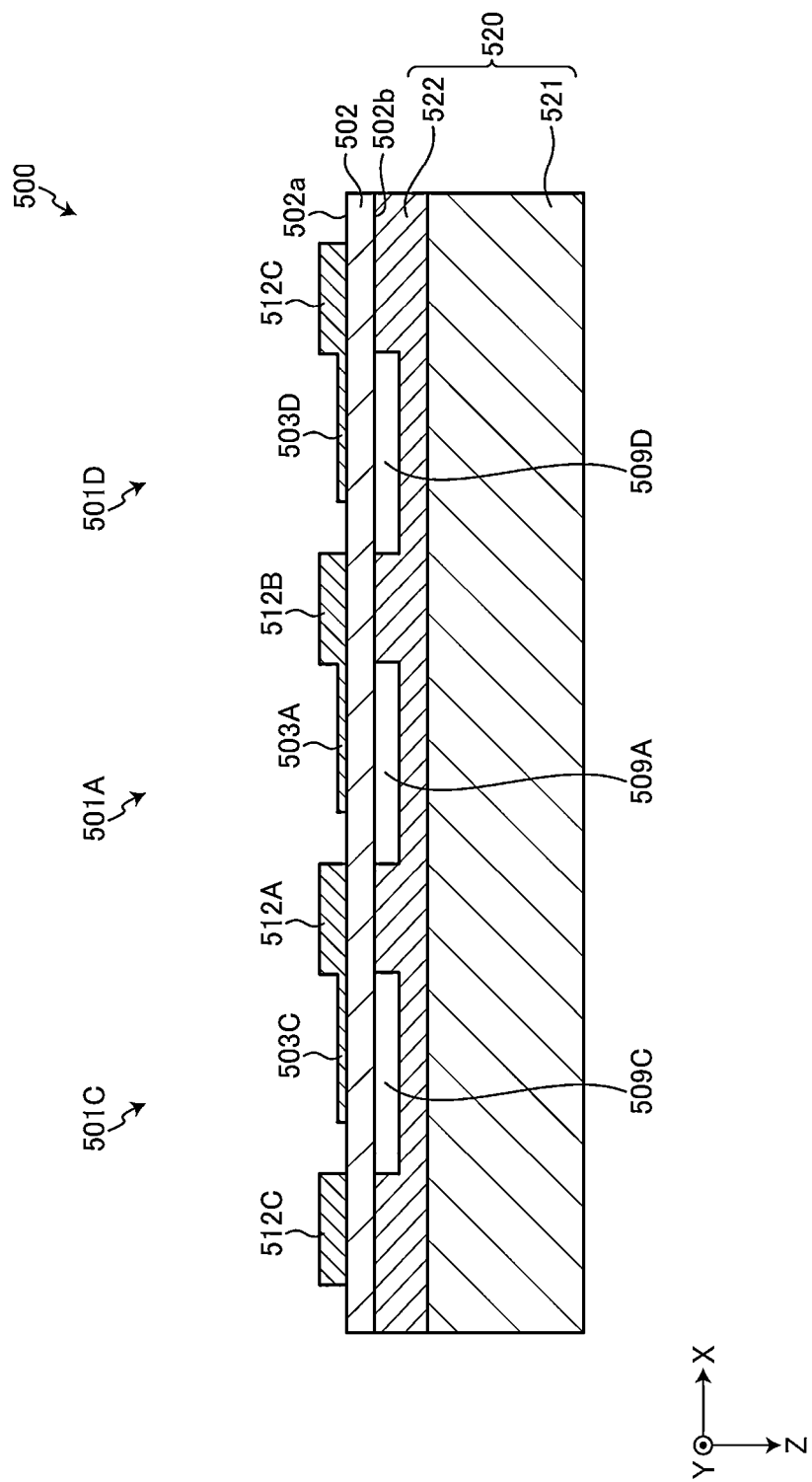
FIG. 15 is a cross-sectional view taken along line XVI-XVI in FIG. 14.
Figure 16:
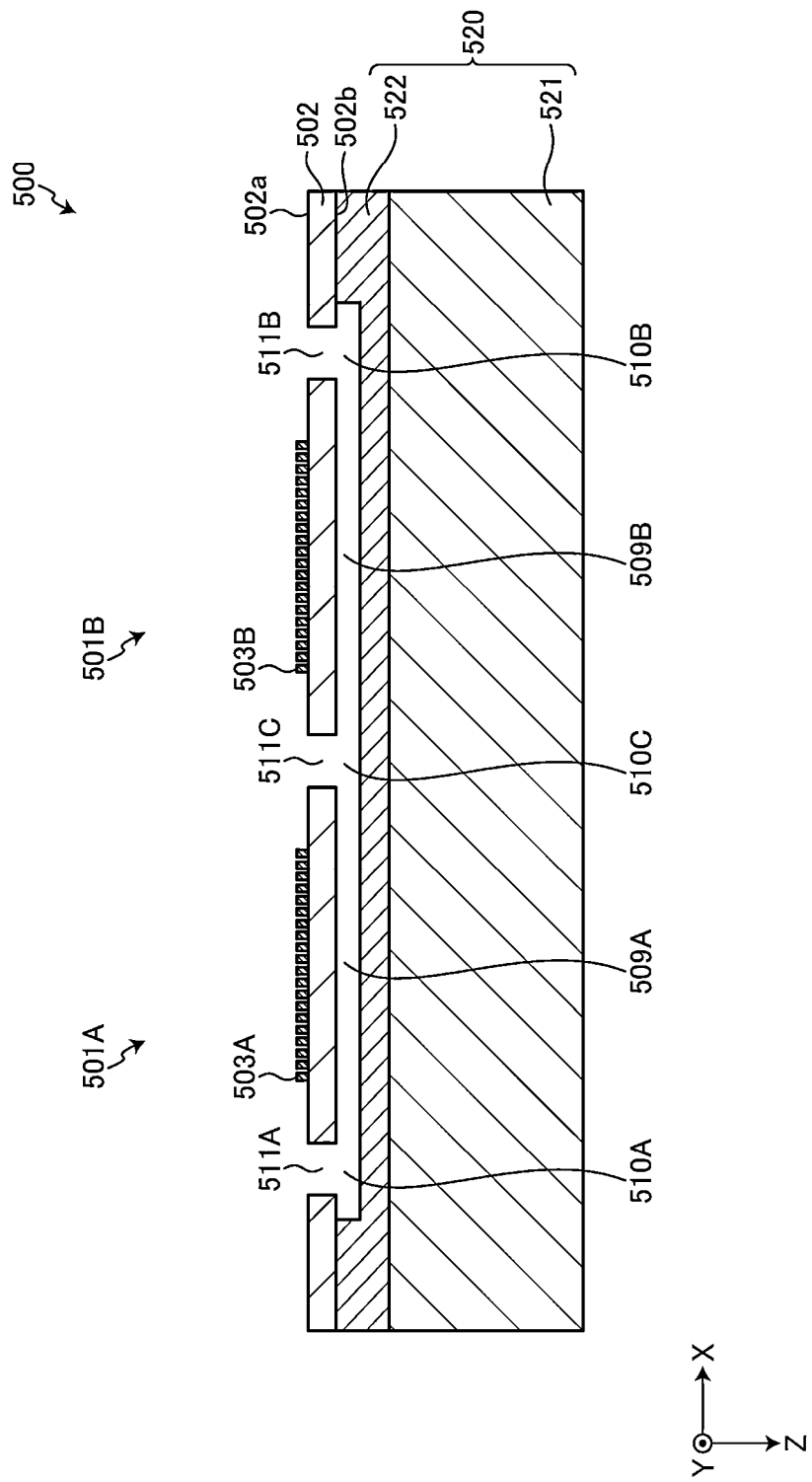
FIG. 16 is a cross-sectional view taken along line XVII-XVII in FIG. 14.

FIG. 14 is a plan view illustrating an example of the acoustic wave device according to the first preferred embodiment. FIG. 15 is a cross-sectional view taken along line XVI-XVI in FIG. 14. FIG. 16 is a cross-sectional view taken along line XVII-XVII in FIG. 14. As illustrated in FIGS. 14 to 16, an acoustic wave device 500 according to the first preferred embodiment is an acoustic wave device provided with a plurality of resonators 501A to 501F. The acoustic wave device 500 includes a support 520, a piezoelectric layer 502, and wiring electrodes 512A to 512C.

The piezoelectric layer 502 is provided on the support 520. The piezoelectric layer 502 includes a first major surface 502a and a second major surface 502b. In the present preferred embodiment, the first major surface 502a is a surface on which the resonators 501A to 501F and the wiring electrodes 512A to 512C are provided. The second major surface 502b is a surface on which the support 520 is provided. The material of the piezoelectric layer 502 may include, for example, lithium niobate (LiNbO$_3$) or lithium tantalate (LiTaO$_3$) and impurities.

As illustrated in FIGS. 15 and 16, the support 520 includes a support substrate 521 and a dielectric layer 522. The material of the support substrate 521 is silicon, for example. The dielectric layer 522 is provided on the piezoelectric layer 502 side with respect to the support substrate 521. The material of the dielectric layer 522 is silicon oxide, for example. The support 520 is not limited to the above configuration. The support 520 does not need to include the dielectric layer 522 and may be the support substrate 521.

The resonators 501A to 501F each include a functional electrode and a multilayer body that at least partially overlaps the functional electrode in a planar view in the Z direction. The functional electrode refers to an IDT electrode that includes a first electrode, a second electrode, a first busbar electrode, and a second busbar electrode. The multilayer body includes a portion of the piezoelectric layer 502 and a portion of the support 520.

In the first preferred embodiment, the resonators 501A to 501F include electrode fingers 503A to 503F as first and second electrodes of the functional electrode. That is, it can be said that the electrode fingers 503A to 503F correspond to the first and second electrodes of the resonators 501A to 501F, respectively. The electrode fingers 503A to 503F have a length direction in the Y direction, and include end portions in the Y direction connected to the wiring electrodes 512A to 512C. More specifically, the electrode fingers 503A and 503B are connected to the wiring electrode 512A or the wiring electrode 512B. The electrode fingers 503C and 503E are connected to the wiring electrode 512A or the wiring electrode 512C. The electrode fingers 503D and 503F are connected to the wiring electrode 512B or the wiring electrode 512C. It can be said that the wiring electrodes 512A to 512C partially serve as busbar electrodes of the resonators 501A to 501F.

The expression "the resonators are adjacent to each other" means that two resonators are arranged side by side without another resonator interposed therebetween. In the example of FIG. 14, the busbar electrodes of adjacent resonators are the same wiring electrodes. In other words, resonators are provided adjacent to each other in the width direction of the wiring electrodes 512A to 512C. The width direction of the wiring electrodes 512A to 512C means a direction perpendicular or substantially perpendicular to a path direction of the wiring electrodes 512A to 512C in a planar view in the Z direction, which is the Y direction in the example of FIG. 14. In the example of FIG. 14, the resonator 501A is adjacent to the resonators 501C and 501D and the resonator 501B is adjacent to the resonators 501E and 501F.

The wiring electrodes 512A to 512C are wirings that electrically connect the resonators 501A to 501F. The wiring electrodes 512A to 512C are provided on the piezoelectric layer 502. The wiring electrode 512A is electrically connected to an input terminal IN (not illustrated) of the acoustic wave device 500. The wiring electrode 512B is electrically connected to the input terminal IN (not illustrated) of the acoustic wave device 500. The wiring electrode 512C is electrically connected to a ground (not illustrated).

Figure 17:
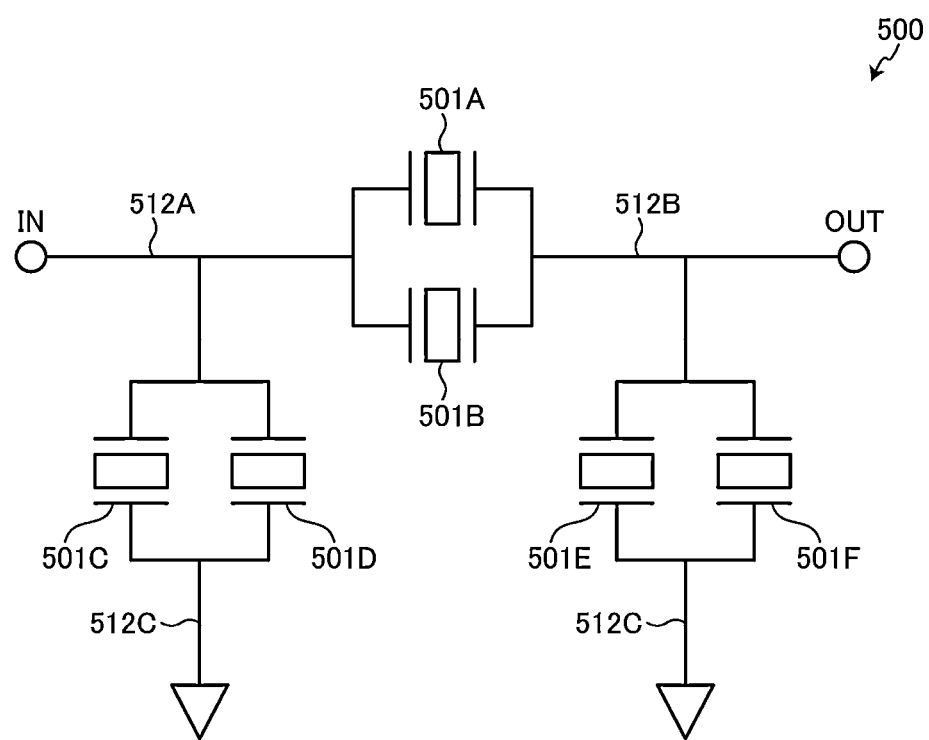
FIG. 17 is a circuit diagram of the acoustic wave device according to the first preferred embodiment of the present invention illustrated in FIG. 14.

FIG. 17 is a circuit diagram of the acoustic wave device according to the first preferred embodiment illustrated in FIG. 14. As illustrated in FIG. 17, the acoustic wave device 500 is, for example, a ladder filter including series arm resonators inserted in series in a signal path from the input terminal IN to an output terminal OUT and parallel arm resonators inserted in a path between the signal path and the ground. In FIG. 17, the series arm resonators are the resonators 501A and 501B. The resonators 501A and 501B each include one terminal electrically connected to the input terminal IN through the wiring electrode 512A, and the other terminal electrically connected to the output terminal OUT through the wiring electrode 512B. The resonators 501A and 501B are electrically connected in parallel. In FIG. 17, the parallel arm resonators are the resonators 501C to 501E. The resonators 501C and 501D each include one terminal electrically connected to the input terminal IN through the wiring electrode 512A, and the other terminal electrically connected to the ground through the wiring electrode 512C. The resonators 501C and 501D are electrically connected in parallel. The resonators 501E and 501F each include one terminal electrically connected to the input terminal IN through the wiring electrode 512B, and the other terminal electrically connected to the ground through the wiring electrode 512C. The resonators 501E and 501F are electrically connected in parallel.

The support 520 is provided with space portions 509A to 509F and lead portions 510A to 510F on the piezoelectric layer 502 side. In the example of FIGS. 15 and 16, the space portions 509A to 509F and the lead portions 510A to 510F are provided on the piezoelectric layer 2 side of the dielectric layer 522. The present disclosure, however, is not limited to such a configuration, and the space portions 509A to 509F and the lead portions 510A to 510F may penetrate the dielectric layer 522 in the Z direction and may also be provided in the support substrate 521. When the support 520 is the support substrate 521, the space portions 509A to 509F and the lead portions 510A to 510F may be provided on the piezoelectric layer 2 side of the support substrate 521.

The space portions 509A to 509F are cavities provided on the piezoelectric layer 502 side of the support 520. The space portions 509A to 509F are provided at positions at least partially overlapping the functional electrodes of the resonators 501A to 501F, respectively, in a planar view in the Z direction. That is, the resonators 501A to 501F include the space portions 509A to 509F provided in the support 520 of the multilayer body. In the following description, the space portion provided in the multilayer body of the resonator may be described as the space portion of the resonator. For example, the space portion 509A is provided in the multilayer body of the resonator 501A, and thus the space portion of the resonator 501A refers to the space portion 509A.

The lead portions 510A to 510F are cavities provided on the piezoelectric layer 502 side of the support 520. The lead portions 510A to 510F are provided at positions not overlapping the lead portions 510A to 510F in a planar view in the Z direction. The lead portions 510A to 510F communicate with at least one of the space portions 509A to 509F. In the example of FIG. 14, the lead portions 510A to 510F are provided so as to communicate with both sides of the space portions 509A to 509F in the X direction.

At least one lead portion communicates with at least two of the space portions 509A to 509F. In the example of FIG. 14, the lead portions 510A to 510D communicate with at least two space portions. The lead portions 510A and 510B are provided so that the space portions of adjacent resonators communicate with each other. In the example of FIG. 14, the lead portion 510A communicates with the space portions 509A, 509C, and 509D, and the lead portion 510B communicates with the space portions 509B, 509E, and 509F. The lead portion may be further provided so that space portions other than those of the adjacent resonators communicate with each other, or may be further provided so as to communicate with only one space portion. In the example of FIG. 14, the lead portion 510C communicates with the space portions 509A and 509B. The lead portion 510D communicates with the space portions 509D and 509F. The lead portion 510E communicates with the space portion 509C. The lead portion 510F communicates with the space portion 509E.

The lead portion 510D includes an overlap portion that overlaps the wiring electrode 512B in a planar view in the Z direction. That is, the lead portion 510D partially overlaps the wiring electrode 512B in a planar view in the Z direction. The lead portion 510D including the overlap portion enables connection of more space portions by the lead portion.

In the example of FIGS. 15 and 16, the lead portions 510A to 510F are provided on the piezoelectric layer 2 side of the dielectric layer 522. The present disclosure, however, is not limited to such a configuration, and the lead portions 510A to 510F may penetrate the dielectric layer 522 in the Z direction and may also be provided in the support substrate 521. When the support 520 is the support substrate 521, the lead portions 510A to 510F may be provided on the piezoelectric layer 2 side of the support substrate 521.

The lead portions 510A to 510F have a width smaller than that of the space portions 509A to 509F. The width of the lead portions 510A to 510F refers to the length in the direction perpendicular to the path of the lead portions 510A to 510F in a planar view in the Z direction. For example, the width of the lead portion 510C refers to the length of the lead portion 510C in the Y direction. The width of the space portions 509A to 509F refers to the length in the direction perpendicular to the direction in which the space portions are communicated with the lead portions 510A to 510F in a planar view in the Z direction. In the example of FIG. 14, the width of the space portions 509A to 509F refers to the length of the space portions 509A to 509F in the Y direction.

The piezoelectric layer 502 is provided with through-holes 511A to 511F, which are holes penetrating in the Z direction. The through-holes 511A to 511F are provided so as to overlap the lead portions 510A to 510F in a planar view in the Z direction. That is, the through-holes 511A to 511F communicate with the lead portions 510A to 510F in the Z direction. The through-holes 511A to 511F are provided at positions not overlapping any of the wiring electrodes 512A to 512C in a planar view in the Z direction. That is, the through-hole 511D communicate with the lead portion 510D having the overlap portion is provided so as not to overlap the overlap portion in a planar view in the Z direction. By providing the through-holes 511A to 511D in the lead portions 510A to 510D communicated with at least two space portions, the etchant can be introduced into a plurality of space portions through one through-hole in manufacturing the acoustic wave device 500.

In the first preferred embodiment, the through-holes 511A to 511F are provided so that the lead portions 510A to 510F overlap at least one of the through-holes 511A to 511F, respectively, in a planar view in the Z direction. That is, the lead portions 510A to 510F communicate with at least one of the through-holes 511A to 511F. With this structure, both sides of the space portions 509A to 509F in the X direction communicate with at least one of the through-holes 511A to 511F through the lead portions 510A to 510F. This makes it possible to discharge the etchant in the space portions 509A to 509F from both sides in the X direction in manufacturing the acoustic wave device 500.

The number of the through-holes 511A to 511F is less than twice the number of the space portions 509A to 509F. In the example of FIG. 14, the number of the through-holes 511A to 511F is, for example, six, while twice the number of the space portions 509A to 509F is, for example, twelve. With this number, the number of through-holes can be reduced compared to the case where one through-hole is provided on each side of the space portions 509A to 509F in the X direction. This makes it possible to provide the resonators more freely.

The acoustic wave device according to the first preferred embodiment is not limited to the acoustic wave device 500 illustrated in FIG. 14. Hereinafter, description is provided of modifications of the acoustic wave device according to the first preferred embodiment with reference to the drawings. The same or substantially the same components are denoted by the same reference numerals, and description thereof is omitted. In FIGS. 17 and 16 illustrating modifications, wiring electrodes are omitted.

Figure 18:
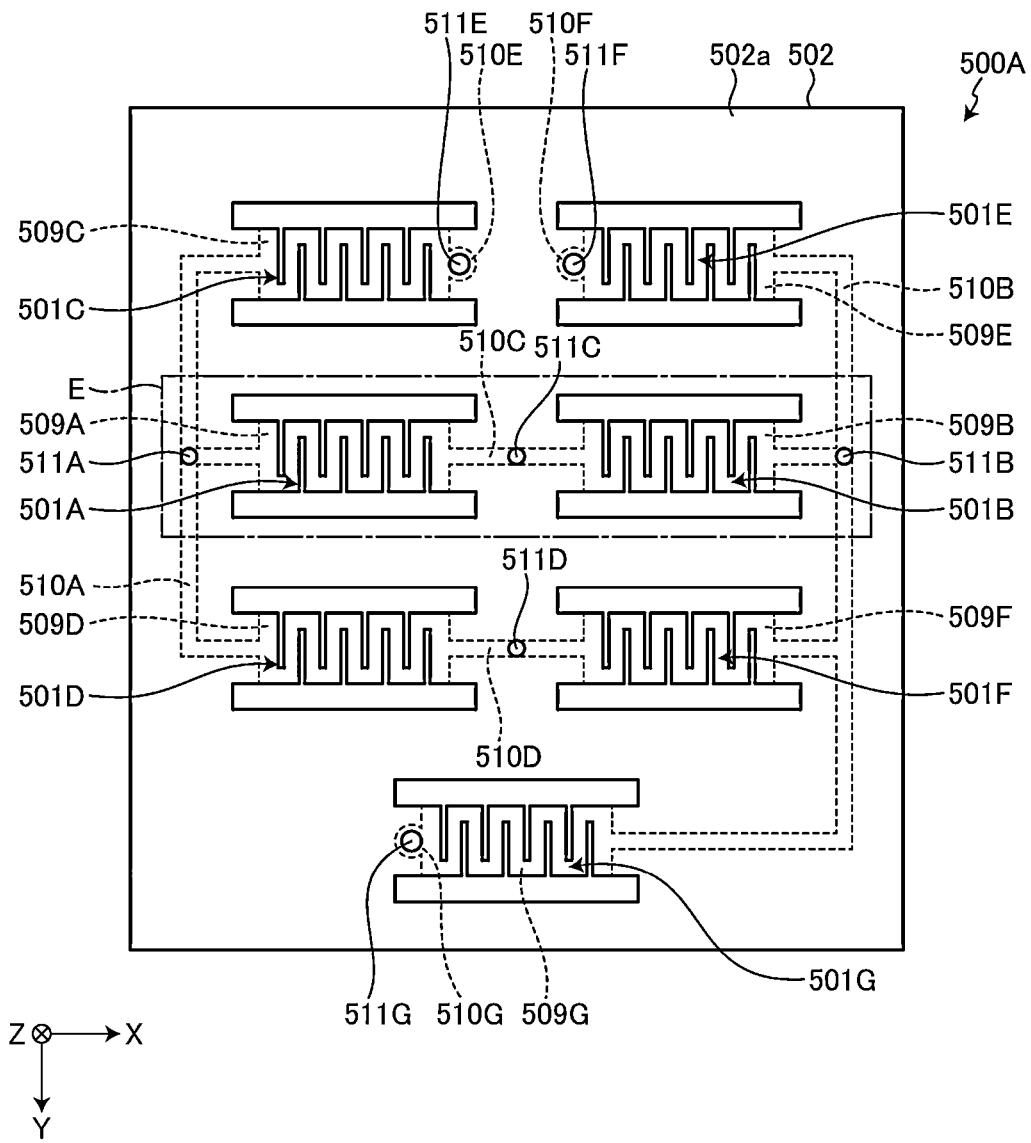
FIG. 18 is a plan view illustrating a first modification of the acoustic wave device according to the first preferred embodiment of the present invention.

FIG. 18 is a plan view illustrating a first modification of the acoustic wave device according to the first preferred embodiment. As in an acoustic wave device 500A illustrated in FIG. 18, the number of through-holes provided in a piezoelectric layer 502 may be an odd number. In the example of FIG. 17, a resonator 501G is further provided, and, for example, seven through-holes 511A to 511G are provided. As in a region E in FIG. 17, through-holes 511A to 511C may be provided so that the number of through-holes is an odd number in a region including two resonators 501A and 501B and the through-holes 511A to 511C near the resonators 501A and 501B. The through-holes near the resonator 501A refer to the through-holes 511A and 511C provided so as to overlap, in a planar view in the Z direction, the lead portions 510A and 510C communicating with the space portion 509A in the resonator 501A. In this case, again, the number of through-holes can be reduced and thus the resonators can be provided more freely.

Figure 19:
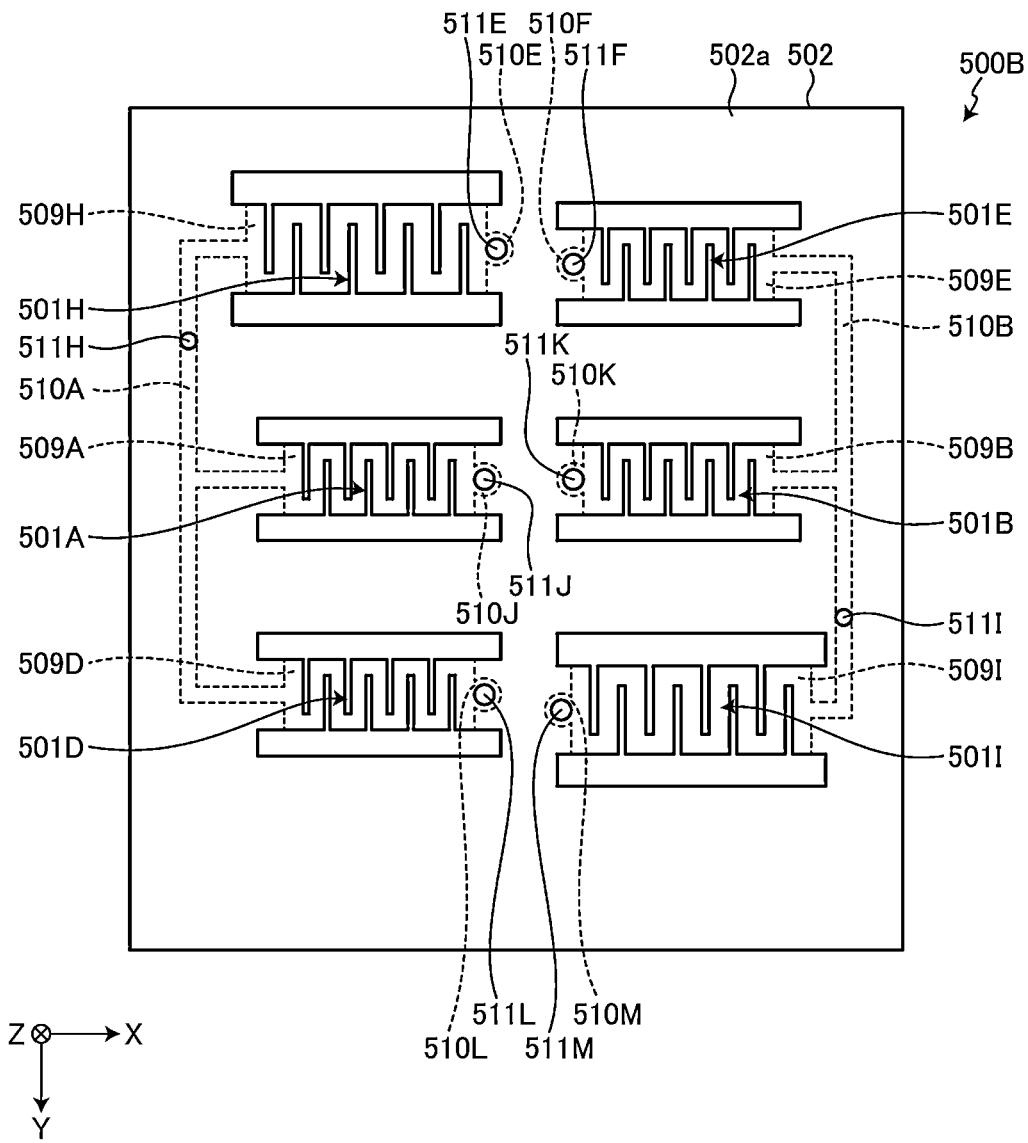
FIG. 19 is a plan view illustrating a second modification of the acoustic wave device according to the first preferred embodiment of the present invention.

FIG. 19 is a plan view illustrating a second modification of the acoustic wave device according to the first preferred embodiment. In an acoustic wave device 500B illustrated in FIG. 19, resonators 501H and 501I are provided, each having a relatively large space portion area in a planar view in the Z direction. In this case, lead portions 510A and 510B communicating with the space portions and through-holes 511H and 511I provided in a planar view in the Z direction are provided closer to the space portions 509H and 509I having a larger area than space portions 509A, 509B, 509D, and 509E having a small area. In the example of FIG. 19, a lead portion 510C communicating with the space portions 509A and 509B is not provided, and a lead portion 510D communicating with the space portions 509D and 509I is not provided. Lead portions 510J to 510M communicating with only the space portions 509A, 509B, 509D, and 509I are provided in a support 520. Through-holes 511J to 511M are provided in the lead portions 510J to 510M, respectively, at positions overlapping each other in a planar view in the Z direction. This can shorten the time required for etching in manufacturing the acoustic wave device 500B.

Figure 20:
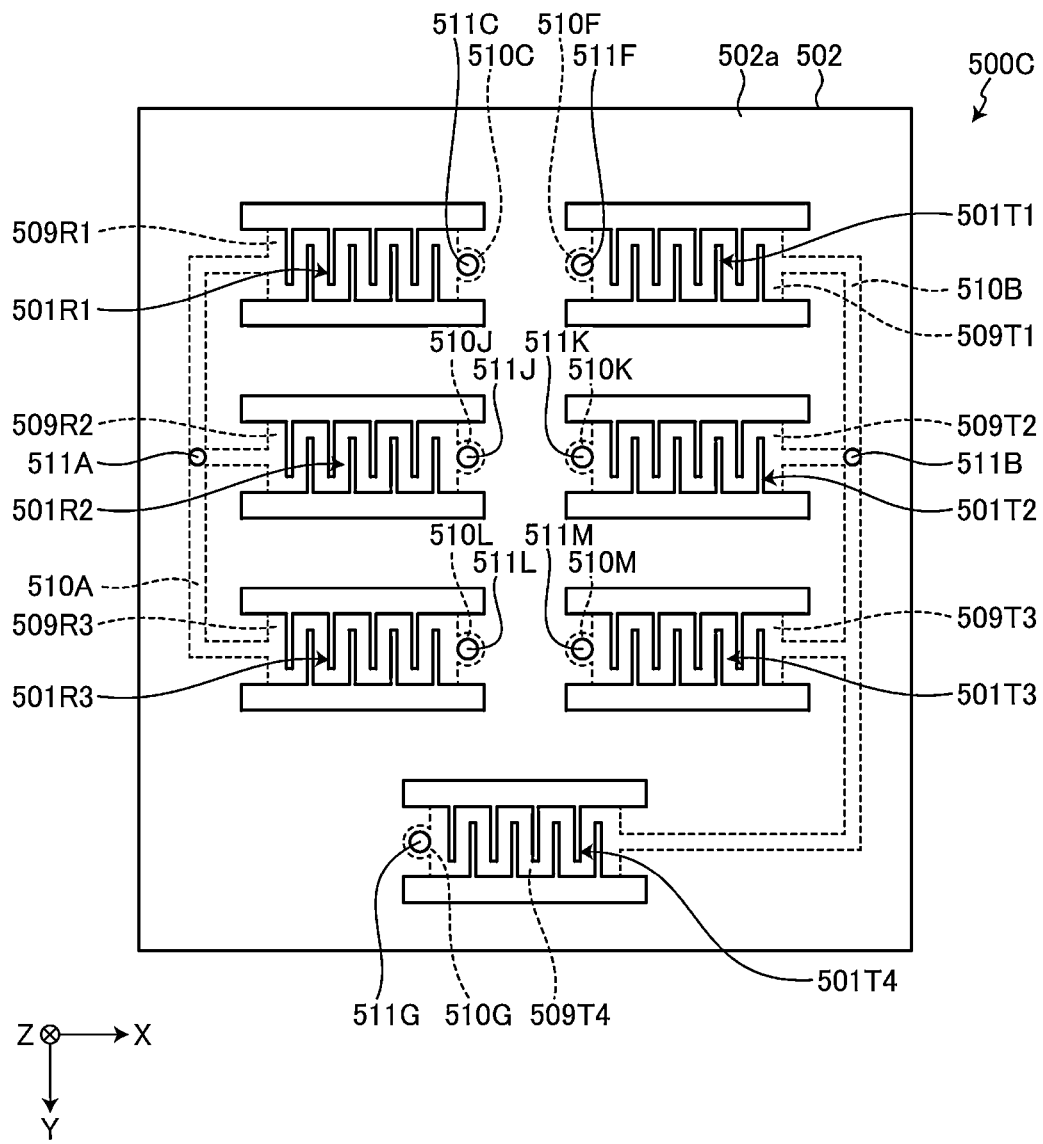
FIG. 20 is a plan view illustrating a third modification of the acoustic wave device according to the first preferred embodiment of the present invention.

FIG. 20 is a plan view illustrating a third modification of the acoustic wave device according to the first preferred embodiment. An acoustic wave device 500C illustrated in FIG. 20 includes transmission resonators 501R1 to 501R3 and reception resonators 501T1 to 501T3. In this case, space portions 509R1 to 509R3 of the transmission resonators 501R1 to 501R3 are connected to each other by a lead portion 510A. Space portions 509T1 to 509T3 of the reception resonators 501T1 to 501T3 are connected by a lead portion 510B. This can improve the transmission and reception isolation characteristics.

It is preferable that the space portions 509R1 to 509R3 of the transmission resonators 501R1 to 501R3 and the space portions 509T1 to 509T3 of the reception resonators 501T1 to 501T4 do not communicate with each other by lead portions. More specifically, a lead portion 510C communicating with the space portions 509R2 and 509T2 is not provided, and a lead portion 510D communicating with the space portions 509R3 and 509T3 is not provided. In the example of FIG. 20, lead portions 510J to 510M communicating with only the space portions 509R2, 509R3, 509T2, and 509T3 are provided in the support 520. Through-holes 511J to 511M are provided in the lead portions 510J to 510M, respectively, at positions overlapping each other in a planar view in the Z direction. This can prevent deterioration of the transmission and reception isolation characteristics.

As described above, the acoustic wave device 500 according to the first preferred embodiment includes the support 520 including the support substrate 521 with a thickness in the first direction, the piezoelectric layer 2 provided in the first direction of the support 520, and the plurality of resonators 501A to 501F each including the functional electrode provided in the first direction of the piezoelectric layer 2. The support 520 includes the plurality of space portions 509A to 509F provided therein at positions at least partially overlapping the functional electrodes of the plurality of resonators 501A to 501F in a planar view in the first direction. The lead portions 510A to 510F communicating with at least one of the space portions 509A to 509F in a planar view in the first direction are provided in the support 520 at positions not overlapping the space portions 509A to 509F. At least one lead portion 510C communicates with at least two space portions 509A and 509B. The through-holes 511A to 511F are provided in the piezoelectric layer 502, which penetrate the piezoelectric layer 502 at positions overlapping the lead portions 510A to 510F in a planar view in the first direction. According to such a configuration, the number of the through-holes can be reduced and thus the resonators can be disposed more freely.

It is preferable that the number of the through-holes is less than twice the number of the space portions. According to such a configuration, the number of the through-holes is reduced compared to the case where two through-holes are provided for each space portion. The resonators can thus be provided more freely.

It is preferable that the wiring electrodes 512A and 512B are further provided in the first direction of the piezoelectric layer to connect at least two functional electrodes. At least one lead portion 510D includes an overlap portion that overlaps the wiring electrode 512B in a planar view in the first direction. This enables connection of more space portions by the lead portion 510D. The resonators can thus be provided more freely.

It is preferable that at least one lead portion 510A communicates with the space portions 509A, 509C, and 509D of the resonators 501A, 501C, and 501D adjacent to each other in a planar view in the first direction. This can further reduce the number of the through-holes. The resonators can thus be provided more freely.

It is preferable that the number of the through-holes is an odd number. In this case, the number of the through-holes can be reduced. The resonators can thus be provided more freely.

The plurality of resonators include a first resonator 501H and second resonators 501A to 501D having an area smaller than that of the first resonator 501H. The space portion 509H of the first resonator 501H and the space portions 509A and 509D of the second resonators 501A and 501D communicate by the lead portion 510A. At least one through-hole 511H is provided at a position closer to the first resonator 501H than the second resonators 501A and 501D in a planar view in the first direction. This can reduce the time required for etching in manufacturing the acoustic wave device 500B.

The plurality of resonators include the reception resonators 501R1 to 501R3 and the transmission resonators 501T1 to 501T4. The space portions 509R1 to 509R3 of the reception resonators 501R1 to 501R3 communicate with each other by the lead portion 510A. The space portions 509T1 to 509T4 of the transmission resonators 501T1 to 501T3 communicate with each other by the lead portion 510B. The space portions 509R1 to 509R3 of the reception resonators 501R1 to 501R3 and the space portions 509T1 to 509T4 of the transmission resonators 501T1 to 501T4 do not communicate with each other by the lead portions 510C and 510D. This can prevent deterioration of the transmission and reception isolation characteristics.

It is preferable that the support 520 further includes the dielectric layer 522 on the piezoelectric layer 502 side, and the space portions 509A to 509F are provided in the dielectric layer 522. This makes it possible to provide an acoustic wave device capable of obtaining good resonance characteristics.

It is preferable that the functional electrode is the IDT electrode including one or more first electrode fingers 3 extending in the second direction intersecting the first direction, and one or more second electrode fingers 4 extending in the second direction and facing any of the one or more first electrode fingers 3 in the third direction orthogonal or substantially orthogonal to the second direction. This makes it possible to provide an acoustic wave device capable of obtaining good resonance characteristics.

It is preferable that the thickness of the piezoelectric layer 2 is about 2p or less where p is the center-to-center distance between the adjacent first electrode finger 3 and second electrode finger 4 among the plurality of first electrode fingers 3 and the plurality of second electrode fingers 4. This makes it possible to reduce the size of the acoustic wave device 1 and to increase the Q value.

It is more preferable that the piezoelectric layer 2 includes lithium niobate or lithium tantalate. This makes it possible to provide an acoustic wave device capable of obtaining good resonance characteristics.

It is further preferable that the Euler angles ($\varphi$, $\theta$, $\psi$) of lithium niobate or lithium tantalate included in the piezoelectric layer 2 are set by the following Expression (1), Expression (2) or Expression (3). In this case, the fractional band width can be sufficiently increased.

$$(0°±10°, 0° \text{ to } 20°, \text{arbitrary } \psi) \quad \text{Equation (1)}$$

$$(0°±10°, 20° \text{ to } 80°, 0° \text{ to } 60°(1-(\theta-50)^2/900)^{1/2}) \text{ or}$$
$$(0°±10°, 20° \text{ to } 80°, [180°-60°(1-(\theta-50)^2/900)^{1/2}] \text{ to } 180°) \quad \text{Equation (2)}$$

$$(0°±10°, [180°-30°(1-(\psi-90)^2/8100)^{1/2}] \text{ to } 180°, \text{arbitrary } \psi) \quad \text{Equation (3)}$$

It is preferable that the acoustic wave device is configured to be able to use thickness-shear mode bulk waves. This makes it possible to increase a coupling coefficient and to provide an acoustic wave device capable of obtaining good resonance characteristics.

It is preferable that d/p is about 0.5 or less, where d is the film thickness of the piezoelectric layer 2 and p is the center-to-center distance between the adjacent first electrode finger 3 and second electrode finger 4. This makes it possible to reduce the size of the acoustic wave device 1 and to increase the Q value.

It is more preferable that d/p is about 0.24 or less. This makes it possible to reduce the size of the acoustic wave device 1 and to increase the Q value.

It is preferable that MR≤about 1.75(d/p)+0.075 is satisfied, where MR is the metallization ratio of the plurality of electrode fingers 3 and 4 to the excitation region C that is the region where the adjacent electrode fingers 3 and 4 overlap in the facing direction. In this case, the fractional band width can be reliably set to about 17% or less.

It is preferable that the acoustic wave device is structured to generate plate waves. This makes it possible to provide an acoustic wave device capable of obtaining good resonance characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support including a support substrate with a thickness in a first direction;
   a piezoelectric layer provided on the support in the first direction; and
   a plurality of resonators each including a functional electrode provided on the piezoelectric layer in the first direction; wherein
   the support includes a plurality of space portions provided therein at positions where the functional electrodes of the plurality of resonators at least partially overlap in a planar view in the first direction;
   the support includes a lead portion, which communicates with at least one of the plurality of space portions in a planar view in the first direction, at a position that does not overlap the at least one space portion;
   at least one lead portion communicates with at least two of the plurality of space portions;
   the at least two of the plurality of space portions are separated from one another by a portion of the support; and
   the piezoelectric layer includes at least one through-hole penetrating the piezoelectric layer at a position overlapping the lead portion in a planar view in the first direction.

2. The acoustic wave device according to claim 1, wherein a number of the at least one through-holes is less than twice a number of the plurality of space portions.

3. The acoustic wave device according to claim 1, wherein the support substrate includes Si.

4. The acoustic wave device according to claim 1, wherein at least one of the lead portions communicates with space portions of the plurality of resonators adjacent to each other in the planar view in the first direction.

5. The acoustic wave device according to claim 1, wherein a number of the at least one through-hole is an odd number.

6. The acoustic wave device according to claim 1, wherein
   the plurality of resonators include a first resonator and a second resonator with an area smaller than an area of the first resonator;
   a space portion of the first resonator and a space portion of the second resonator communicate via the lead portion; and
   at least one of the at least one through-hole is provided at a position closer to the first resonator than to the second resonator in the planar view in the first direction.

7. The acoustic wave device according to claim 1, wherein
   the plurality of resonators include a reception resonator and a transmission resonator;
   space portions of the reception resonator communicate with each other by the corresponding lead portion;
   space portions of the transmission resonator communicate with each other by the corresponding lead portion; and
   the space portions of the reception resonator and the space portions of the transmission resonator do not communicate with each other by the lead portions.

8. The acoustic wave device according to claim 1, wherein
   the support further includes a dielectric layer on a piezoelectric layer side; and
   the plurality of space portions are provided in the dielectric layer.

9. The acoustic wave device according to claim 1, wherein
   the functional electrode includes a plurality of first electrode fingers extending in a second direction intersecting the first direction, and a plurality of second electrode fingers extending in the second direction and facing any of the plurality of first electrode fingers in a third direction orthogonal to the second direction; and
   MR≤about 1.75 (d/p)+0.075 is satisfied, where MR is a metallization ratio of the plurality of first electrode fingers and the plurality of second electrode fingers to an excitation region that is a region where the adjacent first electrode finger and second electrode finger overlap when viewed in a facing direction.

10. The acoustic wave device according to claim 1, wherein the acoustic wave device is structured to generate plate waves.

11. The acoustic wave device according to claim 1, wherein the functional electrode includes an upper electrode and a lower electrode sandwiching the piezoelectric layer in the first direction.

12. The acoustic wave device according to claim 1, wherein a thickness of the piezoelectric layer more than or equal to about 50 nm and less than or equal to about 1000 nm.

13. An acoustic wave device comprising:
    a support including a support substrate with a thickness in a first direction;
    a piezoelectric layer provided on the support in the first direction; and
    a plurality of resonators each including a functional electrode provided on the piezoelectric layer in the first direction; wherein
    the support includes a plurality of space portions provided therein at positions where the functional electrodes of the plurality of resonators at least partially overlap in a planar view in the first direction;

the support includes a lead portion, which communicates with at least one of the space portions in a planar view in the first direction, at a position that does not overlap the space portion;

at least one lead portion communicates with at least two of the space portions;

the piezoelectric layer includes a through-hole penetrating the piezoelectric layer at a position overlapping the lead portion in a planar view in the first direction; and the functional electrode is an interdigital transducer (IDT) electrode including one or more first electrode fingers extending in a second direction intersecting the first direction, and one or more second electrode fingers extending in the second direction and facing any of the one or more first electrode fingers in a third direction orthogonal or substantially orthogonal to the second direction.

14. The acoustic wave device according to claim 13, wherein a thickness of the piezoelectric layer is less than or equal to about 2p where p is a center-to-center distance between the adjacent first electrode finger and second electrode finger among the one or more first electrode fingers and the one or more second electrode fingers.

15. The acoustic wave device according to claim 13, wherein the piezoelectric layer includes lithium niobate or lithium tantalate.

16. The acoustic wave device according to claim 15, wherein

Euler angles ($\phi$, $\theta$, $\psi$) of the lithium niobate or lithium tantalate are given by Expression (1), Expression (2) or Expression (3):

$(0°\pm10°, 0°$ to $20°,$ arbitrary $\psi)$      Expression (1);

$(0°\pm10°, 20°$ to $80°, 0°$ to $60°(1-(\theta-50)2/900)^{1/2})$ or $(0°\pm10°, 20°$ to $80°, [180°-60°(1-(\theta-50)^2/900)^{1/2}]$ to $180°)$      Expression (2)

$(0°\pm10°, [180°-30°(1-(\psi-90)^2/8100)^{1/2}]$ to $180°,$ arbitrary $\psi)$      Expression (3)

17. The acoustic wave device according to claim 13, wherein the acoustic wave device is structured to generate thickness-shear mode bulk waves.

18. The acoustic wave device according to claim 17, wherein d/p is less than or equal to about 0.5, where d is the thickness of the piezoelectric layer and p is the center-to-center distance between the adjacent first electrode finger and second electrode finger among the one or more first electrode fingers and the one or more second electrode fingers.

19. The acoustic wave device according to claim 18, wherein d/p is less than or equal to about 0.24.

20. An acoustic wave device comprising:

a support including a support substrate with a thickness in a first direction;

a piezoelectric layer provided on the support in the first direction;

a plurality of resonators each including a functional electrode provided on the piezoelectric layer in the first direction; and a wiring electrode provided in the first direction of the piezoelectric layer to connect at least two of the functional electrodes; wherein the support includes a plurality of space portions provided therein at positions where the functional electrodes of the plurality of resonators at least partially overlap in a planar view in the first direction;

the support includes a lead portion, which communicates with at least one of the space portions in a planar view in the first direction, at a position that does not overlap the space portion;

at least one lead portion communicates with at least two of the space portions;

the piezoelectric layer includes a through-hole penetrating the piezoelectric layer at a position overlapping the lead portion in a planar view in the first direction; and at least one of the lead portions includes an overlap portion that overlaps the wiring electrode in the planar view in the first direction.

* * * * *